(12) United States Patent
Wu et al.

(10) Patent No.: US 11,227,787 B2
(45) Date of Patent: Jan. 18, 2022

(54) TRANSFER SUPPORT AND TRANSFER MODULE

(71) Applicant: Industrial Technology Research Institute, Hsinchu (TW)

(72) Inventors: Ming-Hsien Wu, Tainan (TW); Yih-Der Guo, Hsinchu (TW); Yen-Hsiang Fang, New Taipei (TW); Yao-Jun Tsai, Taoyuan (TW); Yi-Chen Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 334 days.

(21) Appl. No.: 16/026,080

(22) Filed: Jul. 3, 2018

(65) Prior Publication Data

US 2019/0019718 A1 Jan. 17, 2019

Related U.S. Application Data

(63) Continuation-in-part of application No. 15/847,950, filed on Dec. 20, 2017, now Pat. No. 10,431,483.

(30) Foreign Application Priority Data

Jul. 14, 2017 (TW) .................................. 10612359.8
Mar. 30, 2018 (TW) .................................. 10711140.7

(51) Int. Cl.
*H01L 21/683* (2006.01)
*H01L 21/67* (2006.01)

(52) U.S. Cl.
CPC .... *H01L 21/6838* (2013.01); *H01L 21/67144* (2013.01); *H01L 21/6835* (2013.01); *H01L 2221/68368* (2013.01)

(58) Field of Classification Search
CPC ............ H01L 21/6838; H01L 21/6835; H01L 21/67144; H01L 2221/68368
(Continued)

(56) References Cited

U.S. PATENT DOCUMENTS 4,049,484 A * 9/1977 Priest ........................ B44C 1/16
156/285
4,997,121 A * 3/1991 Yoshimura ............. B23K 1/018
228/20.5

(Continued)

FOREIGN PATENT DOCUMENTS

| CN | 105263854 | 1/2016 |
| CN | 105493297 | 4/2016 |

(Continued)

OTHER PUBLICATIONS

Sang-Il Park, et al., "Printed Assemblies of Inorganic Light-Emitting Diodes for Deformable and Semitransparent Displays," Science, vol. 325, Aug. 21, 2009, pp. 977-981.
(Continued)

*Primary Examiner* — Paul T Chin
(74) *Attorney, Agent, or Firm* — JCIPRNET

(57) ABSTRACT

A transfer support adapted to contact a plurality of elements is provided. The transfer support has a first surface, a second surface opposite to the first surface, a recess located on the second surface, a plurality of platforms protruded from the first surface, a plurality of supporting pillars distributed in the recess and a plurality of through holes. The platforms have carry surfaces adapted to contact the plurality of elements. The through holes extend from the carry surfaces of the platforms to the recess, and two of the adjacent supporting pillars are spaced apart from each other to form an air passage. In addition, a transfer module is also provided.

17 Claims, 27 Drawing Sheets

(58) Field of Classification Search
USPC .................................................. 294/188, 65
See application file for complete search history.

(56) References Cited

U.S. PATENT DOCUMENTS

| | | | |
|---|---|---|---|
| 5,749,614 | A | 5/1998 | Reid et al. |
| 7,278,204 | B2* | 10/2007 | Isogai ..................... H05K 13/04 |
| | | | 29/721 |
| 7,347,347 | B2 | 3/2008 | Kira et al. |
| 8,333,860 | B1 | 12/2012 | Bibl et al. |
| 8,349,116 | B1 | 1/2013 | Bibl et al. |
| 8,383,506 | B1 | 2/2013 | Golda et al. |
| 9,358,775 | B2 | 6/2016 | Bower et al. |
| 9,368,683 | B1 | 6/2016 | Meitl et al. |
| 2003/0062734 | A1* | 4/2003 | Faris ..................... B25B 11/005 |
| | | | 294/188 |
| 2003/0164620 | A1* | 9/2003 | Schmalz ................. B66C 1/025 |
| | | | 294/188 |
| 2008/0138631 | A1* | 6/2008 | Patel ................... G03F 7/70916 |
| | | | 428/427 |
| 2009/0273199 | A1* | 11/2009 | Joguet ..................... B65G 47/91 |
| | | | 294/188 |
| 2011/0070410 | A1* | 3/2011 | Huang ..................... B32B 21/10 |
| | | | 428/195.1 |
| 2013/0082475 | A1* | 4/2013 | Fukano ................. B25B 11/007 |
| | | | 294/188 |
| 2013/0330879 | A1 | 12/2013 | Maki et al. |
| 2014/0044516 | A1* | 2/2014 | Sanchez ................ H01L 21/673 |
| | | | 414/816 |
| 2014/0062112 | A1* | 3/2014 | Cho ..................... B25J 15/0675 |
| | | | 294/188 |
| 2015/0340262 | A1 | 11/2015 | Bibl |
| 2017/0221830 | A1* | 8/2017 | Scanlan ................. H01L 24/19 |

FOREIGN PATENT DOCUMENTS

| | | |
|---|---|---|
| CN | 106941090 | 7/2017 |
| TW | I231167 | 4/2005 |
| TW | 201332140 | 8/2013 |
| TW | 201425207 | 7/2014 |

OTHER PUBLICATIONS

Christopher A. Bower, "Flexible, Hybrid Electronics by Micro-Transfer-Printing," Semicon West, Jul. 2016, pp. 1-14.
John Rogers, "Micro-Transfer Printing—Flexible and Stretchable Electronics," Science, vol. 333, Sep. 2011, pp. 1-12.
Andrew Carlson, et al., "Transfer Printing Techniques for Materials Assembly and Micro/Nanodevice Fabrication," Advanced Materials, vol. 24, 2012, pp. 5284-5318.
Bok Y. Ahn, et al., "Omnidirectional Printing of Flexible, Stretchable, and Spanning Silver Microelectrodes," Science, vol. 323, Mar. 20, 2009, pp. 1590-1593.
"Office Action of Taiwan Counterpart Application," dated Sep. 7, 2018, pp. 1-3.

* cited by examiner

TRANSFER SUPPORT AND TRANSFER MODULE

CROSS-REFERENCE TO RELATED APPLICATION

This application is a continuation-in-part application of and claims the priority benefit of a prior application Ser. No. 15/847,950, filed on Dec. 20, 2017, now pending. The prior application Ser. No. 15/847,950 claims the priority benefit of Taiwan application serial no. 106123598, filed on Jul. 14, 2017. This continuation-in-part application also claims the priority benefit of Taiwan application serial no. 107111407, filed on Mar. 30, 2018. The entirety of each of the above-mentioned patent applications is hereby incorporated by reference herein and made a part of this specification.

TECHNICAL FIELD

The technical field relates to a transfer support and a transfer module, and particularly to an attraction-type transfer support and a transfer module.

BACKGROUND

Inorganic light emitting diode display has features of self-luminous, high brightness and so on, and therefore has been widely applied in the fields of illumination, display and so forth. Take monolithic micro-display as an example. Monolithic micro-display has been constantly faced with a bottleneck of colorizing technology. A conventional technology for manufacturing a plurality of light emitting layers capable of emitting different colored lights in a single light emitting diode chip by epitaxial technique has already been provided, such that the single light emitting diode chip can provide different colored lights. Because lattice constants of the light emitting layers capable of emitting different colored lights are different, growth of the light emitting layers on a same substrate is difficult. In addition, another conventional technology has provided a colorizing technique utilizing a light emitting diode chip in collocation with different color conversion materials; when the light emitting diode chip emits light, the color conversion materials are excited so as to emit exciting light with different colored lights, but this technology is still facing problems of low conversion efficiency of the color conversion materials, coating uniformity and so forth.

Apart from the two colorizing technologies as mentioned above, there is also another conventional technique that provides a transfer-bonding technique of light emitting diode. Since the light emitting didoes capable of emitting different colored lights can respectively be grown on a suitable substrate, the light emitting diodes are more likely to have a better epitaxial quality and light-emitting efficiency. Therefore, the transfer-bonding technique of the light emitting diode has a better chance to enhance brightness and display quality of a monolithic micro-display. However, rapidly and efficiently transfer-bonding the light emitting diode to a circuit substrate of the monolithic micro-display is in fact one of the recently concerned issues of industry.

SUMMARY

The disclosure provides a transfer support and a transfer module, which is capable of transferring an element to a target substrate rapidly and efficiently.

One of exemplary embodiments provides a transfer support adapted to contact a plurality of elements. The transfer support has a first surface, a second surface opposite to the first surface, a recess located on the second surface, a plurality of platforms protruded from the first surface, a plurality of supporting pillars distributed in the recess, and a plurality of through holes. The platforms have a plurality of carry surfaces adapted to contact the plurality of elements. The through holes extend from the carry surfaces to the recess.

Another of exemplary embodiments provides a transfer module adapted to attract a plurality of elements. The transfer module includes a vacuum apparatus and the transfer support. The vacuum apparatus has at least one exhausting vent. The transfer support is disposed on the vacuum apparatus to cover the exhausting vent.

In summary, in the transfer module of the disclosure, the transfer support is disposed on the vacuum apparatus so that the exhausting vent communicates with a plurality of through holes, and thus attracting the plurality of elements to the platforms via the plurality of through holes, thereby transferring the elements to a target substrate rapidly and efficiently.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
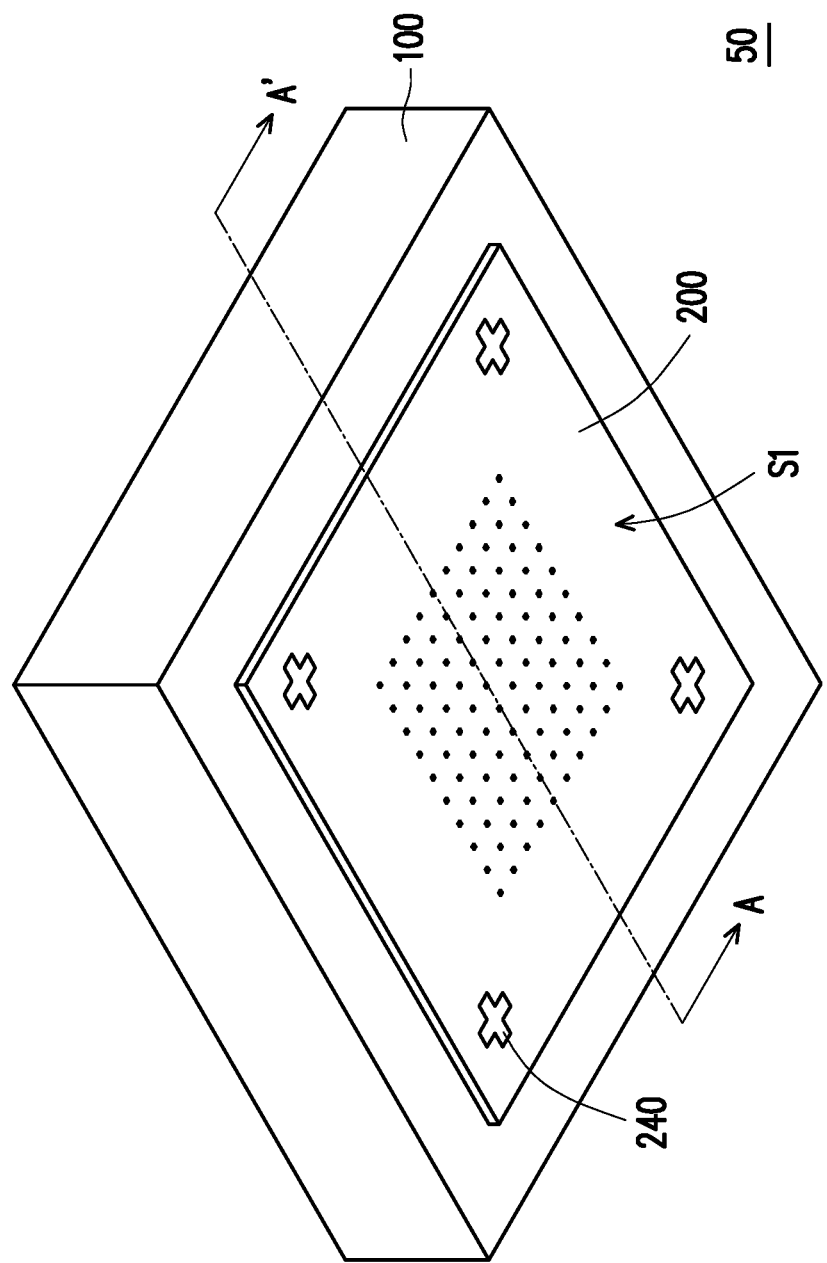
FIG. 1 is a three-dimensional bottom view illustrating a transfer module according to an embodiment of the disclosure.
Figure 2:
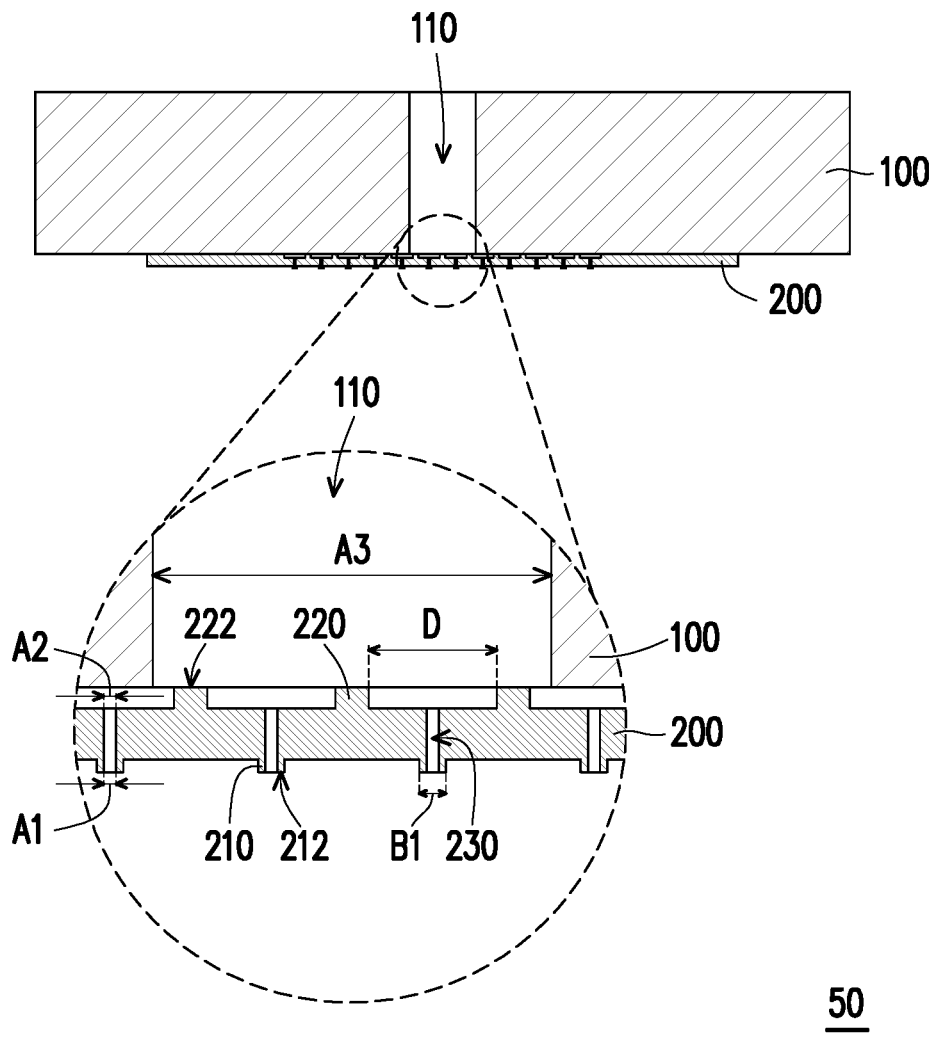
FIG. 2 is a cross-sectional view illustrating the transfer module of FIG. 1 along line A-A'.
Figure 5:
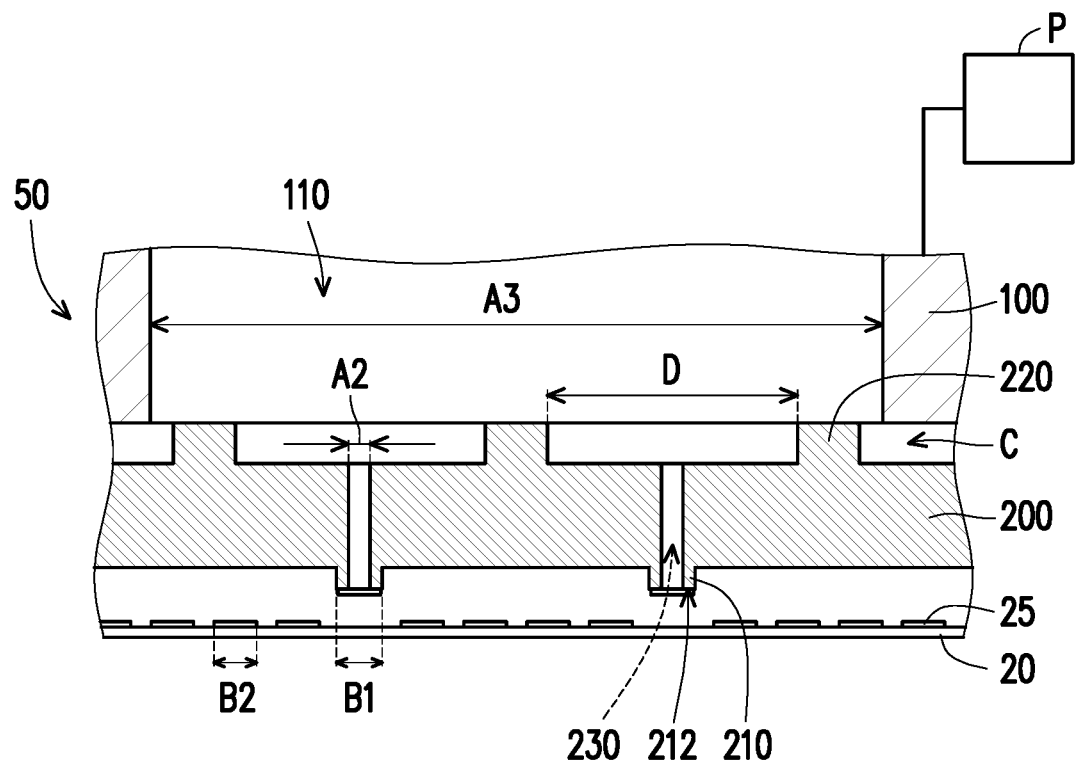
FIG. 5 is a partial enlargement view illustrating the transfer module in FIG. 2 attracting a plurality of elements.

FIG. 1 is a three-dimensional bottom view illustrating a transfer module according to an embodiment of the disclosure. FIG. 2 is a cross-sectional view illustrating the transfer module of FIG. 1 along line A-A'. FIG. 5 is a partial enlargement view illustrating the transfer module in FIG. 2 attracting a plurality of elements. Referring to FIGS. 1, 2 and 5, in the embodiment, a transfer module 50 is adapted to attract a plurality of elements 25. The elements 25 are, for example, a plurality of micro-LED chips or other micro elements. The transfer module 50 includes a vacuum apparatus 100 and a transfer support 200. The vacuum apparatus 100 has an exhausting vent 110. However, in other embodiments, the vacuum apparatus 100 may have a plurality of exhausting vents 110. The transfer support 200 is disposed on the vacuum apparatus 100 to cover the exhausting vent 110.

Figure 3:
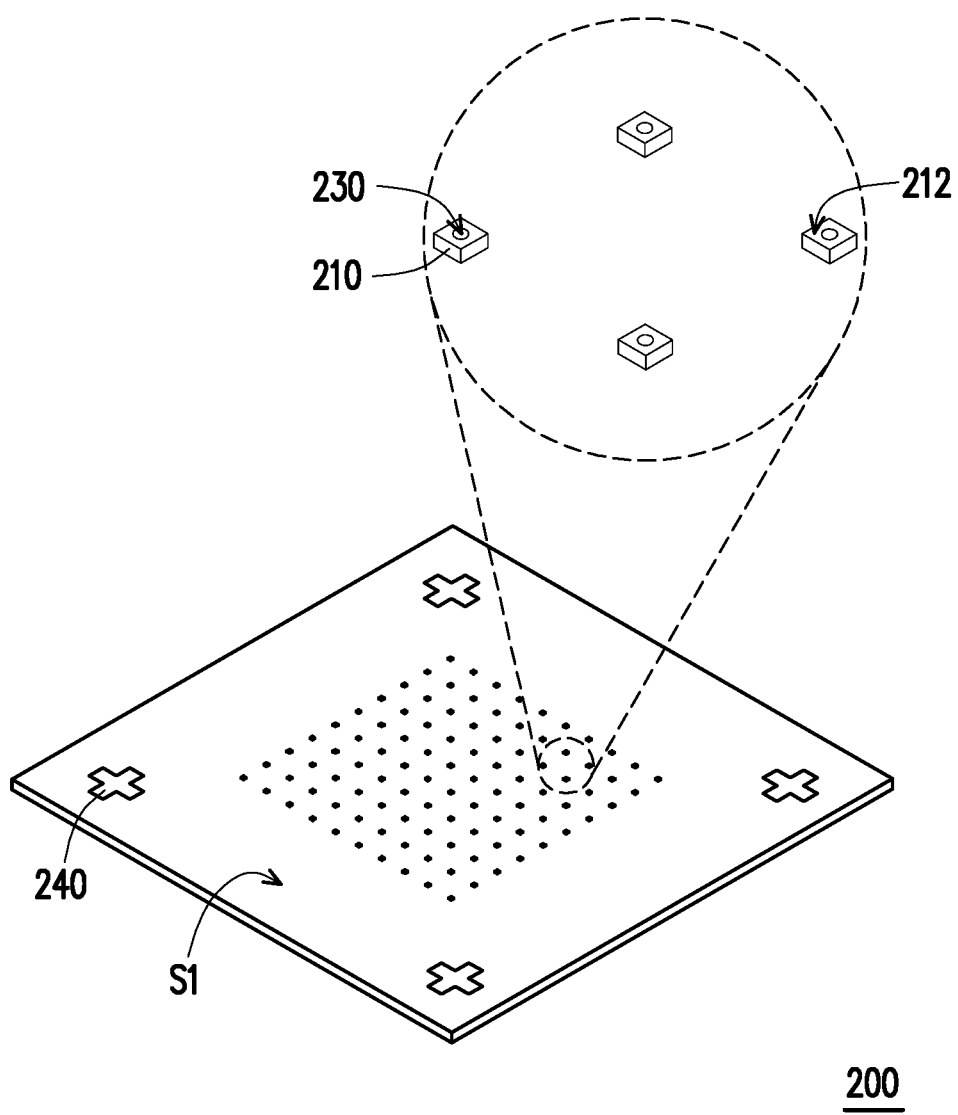
FIGS. 3 and 4 are respectively three-dimensional bottom view and top view illustrating the transfer support of FIG. 1.
Figure 4:
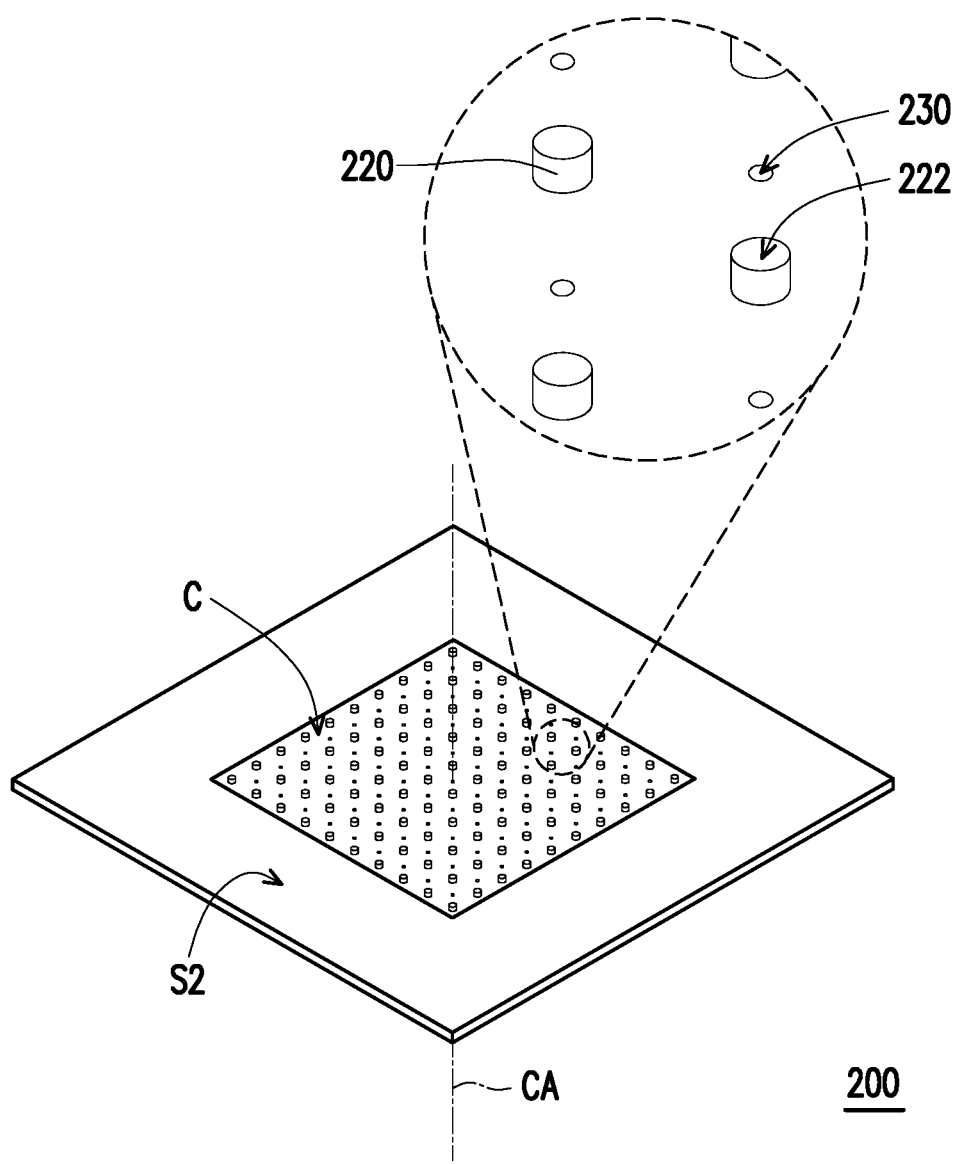

FIGS. 3 and 4 are respectively three-dimensional bottom view and top view illustrating the transfer support of FIG. 1. Referring to FIGS. 2 to 5, the transfer support 200 is adapted to contact the plurality of elements 25. The transfer support 200 has a first surface S1, a second surface S2 opposite to the first surface S1, a recess C located on the second surface S2, a plurality of platforms 210 protruded from the first surface S1, a plurality of supporting pillars 220 distributed in the recess C, and a plurality of through holes 230. The through holes 230 are, for example, formed by an etching process or other suitable process. The through holes 230 extend from carry surfaces 212 of the platforms 210 to the recess C. In some embodiment, each of the through holes 230 may extend from carry surfaces 212 of the platforms 210 to the recess C. In some alternative embodiments, only parts of the through holes 230 satisfy the above-described condition. The adjacent supporting pillars 220 are spaced apart from each other by a distance D (e.g., see FIG. 2).

In other words, an orthogonal projection of the supporting pillars 220 on the first surface S1 and an orthogonal projection of the platforms 210 on the first surface S1 are staggered. In some embodiments, each of the supporting pillars 220 on the first surface S1 and an orthogonal projection of each of the platforms 210 on the first surface S1 are staggered. In some alternative embodiments, only parts of the supporting pillars 220 and the platforms 210 satisfy the above-described condition. The supporting pillars 220 and the platforms 210 are respectively distributed on the second surface S2 and the first surface S1. In the embodiment, the platforms 210 are distributed corresponding to the recess C. Specifically, an orthogonal projection of the platforms 210 on the first surface S1 is in a range covered by the orthogonal projection of the recess C on the first surface S1. In other words, the range covered by the recess C on the transfer support 200 is larger than a range covered by the platforms 210 on the transfer support 200, and the range covered by the recess C on the transfer support 200 is smaller than a size of the transfer support 200. In some embodiments, an orthogonal projection of each of the platforms 210 on the first surface S1 is in a range covered by the orthogonal projection of the recess C on the first surface S1. In some alternative embodiments, only parts of the platforms 210 satisfy the above-described condition. In addition, in the embodiment, a central axis CA of the recess C passes through a center of the transfer support 200. In other words, the center of the recess C corresponds to a center of the transfer support 200 as shown in FIG. 4, which should not be construed as a limitation to the disclosure. Therefore, a plurality of platforms 210 on the first surface S1 are arranged in arrays, and the arrays of the plurality of through holes 230 and the plurality of supporting pillars 220 are staggered arranged in the recess C on the second surface S2, as shown in FIGS. 3 to 4.

Referring to FIGS. 2 and 5, in the embodiment, a size B1 of the platforms 210 is larger than a size B2 of the elements 25. The size B2 of the elements 25 is larger than an aperture A2 (i.e., aperture A1) of the through hole 230. The height of the protruded platforms 210 protruding from the first surface S1 is, for example, larger than 2 micrometers. An aperture A1 of an attraction terminal of the through hole 230 is equal to the aperture A2 of a pumping terminal. In other words, in the embodiment, the through hole 230 is a columnar through hole, which should not be construed as a limitation to the disclosure. An aperture A3 of the exhausting vent 110 is larger than the apertures A1 and A2 of the through hole 230 and the size B2 of the elements 25. In addition, two of the adjacent supporting pillars 220 are spaced apart by at least one distance D so as to faun a communicating air passage.

Referring to FIGS. 1 and 3, in the embodiment, the transfer support 200 further includes a plurality of marking structures 240 protruded from the first surface S1, wherein the height of the marking structure 240 is smaller than the height of the platforms 210. Accordingly, before the transferring process of the elements 25 begins, the marking structure 240 is aligned with a carrier substrate 20 of an elements 25 (e.g., see FIG. 5), thereby enhancing the precision of aligning the platforms 210 with the elements 25.

In brief, the second surface S2 of the transfer support 200 abuts against the vacuum apparatus 100 so that the exhausting vent 110 communicates with the recess C located on the surface S2, such that the exhausting vent 110 communicates with the plurality of through holes 230. That is to say, when the transfer module 50 is activated, the vacuum apparatus 100 can pump the air from the exhausting vent 110, the recess C and the plurality of through holes 230 so as to attract the plurality of elements 25 that contact the terminal of the plurality of through holes 230 (i.e., contact the carry surface 212 of the platforms 210). Therefore, when the elements 25 are attracted, the transfer module 50 is aligned with the plurality of elements 25 of the carrier substrate 20 via the plurality of platforms 210 on the first surface S1 in the transfer support 200, pumping the air in the plurality of through holes 230 communicating the exhausting vent 110 via the vacuum apparatus 100, thereby attracting the plurality of elements 25 to the plurality of carry surfaces 212 of the plurality of platforms 210 as shown in FIG. 5.

On the other hand, in the embodiment, a supporting surface 222 of the plurality of supporting pillars 220 distributed in the recess C is substantially coplanar with the second surface S2. Therefore, when the second surface S2 of the transfer support 200 abuts against the vacuum apparatus 100, the plurality of supporting pillars 220 in the transfer support 200 provides sufficient support to the vacuum apparatus 100, thereby enhancing the mechanical strength of the transfer module 50. In addition, since the plurality of supporting pillars 220 are distributed in a portion of the space in the recess C, a plurality of vacuum flow field paths communicating the exhausting vent 110 with the plurality of through holes 230 can be further provided.

Further referring to FIG. 5, in the embodiment, an arrangement pitch between two of the adjacent platforms 210 on the transfer support 200 is an arrangement pitch between two or more elements 25 among the plurality of elements 25. However, in other embodiments, the arrangement pitch between two of the adjacent platforms 210 may be equal to the arrangement pitch between two of the adjacent elements 25, and may be any integer multiple of an arrangement pitch between the adjacent elements 25. In other words, in the transfer module 50 of the disclosure, the transfer support 200 with the platforms 210 spaced apart by different distances may be used depending on the requirement of different elements, thereby reducing developing cost of the transfer module 50 to correspond to the elements 25 with different dimensions or fabricated via different processes.

On the other hand, in the embodiment, the vacuum apparatus 100 includes a control unit P to switch on/off the exhausting vent 110. In other embodiment, the vacuum apparatus 100 may control a plurality of switches corresponding to the plurality of exhausting vents 110 via the control unit P, thereby switching on/off the exhausting vents 110 to attract the elements 25 located at different positions. Accordingly, not only that portions of the elements 25 which are located at specific positions can be transferred according to design requirements, the attracted elements 25 can also be addressed and regionally attracted via the transfer module 50 through the controlling of the control unit P.

Furthermore, the transfer module 50 of the disclosure may be applied to massive transfer technique to achieve package with high throughput and low cost, such as a light emitting diode package or integrated circuit package. Also the transfer module 50 of the disclosure may be applied to various display devices, electronic elements or multi-function micro systems using micro LED, thereby improving throughput of package, reducing cost of package and enhancing package yield.

FIGS. 6A to 6L are schematic views illustrating platforms in different embodiments. Referring to FIGS. 6A to 6D, in different embodiments, the platform may be selected from a cylindrical platform 210A illustrated in FIG. 6A, a polygonal columnar platform 210B and 210C or a trapezoid columnar platform 210D. In other words, the platform in the transfer support in the disclosure may be formed with different shapes to adapt to the elements to be transferred with different shapes, which should not be construed as a limitation to the disclosure.

Referring to FIGS. 6E to 6H, in different embodiments, the platform may have an arc-shaped structure at an edge of the platform, and the position of the arc-shaped structure may be at an inner edge of a carry surface 212A of the platform 210E (as the arc-shaped structure 214A shown in FIG. 6E), an outer edge of a carry surface 212B of the platform 210F (as the arc-shaped structure 214B illustrated in FIG. 6F), a corner in the side wall of the platform 21G (as the arc-shaped structure 214C illustrated in FIG. 6G) or a boundary between the platform 210H and the first surface S1 (as the arc-shaped structure 214D illustrated in FIG. 6H), which should not be construed as a limitation to the disclosure. In this manner, a stress generated between the platforms 210E, 210F, 210G, 210H and the elements 25 may be reduced when the transfer module 50 transfers the elements 25.

Figure 6A:
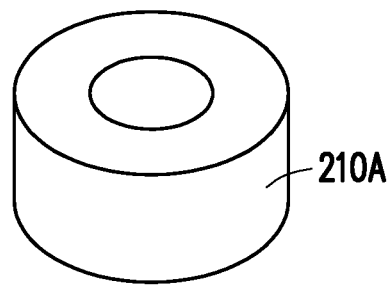
FIGS. 6A to 6L are schematic views illustrating platforms in different embodiments.
Figure 6B:
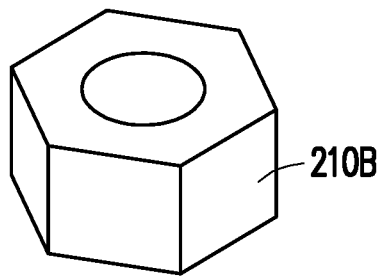
Figure 6C:
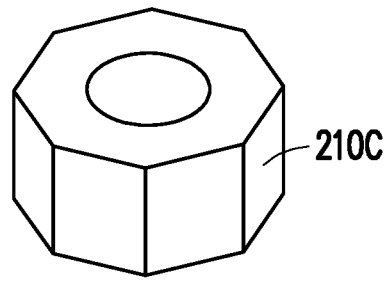
Figure 6D:
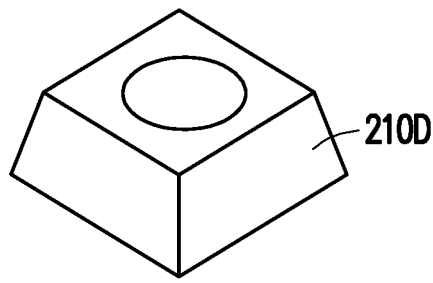
Figure 6E:
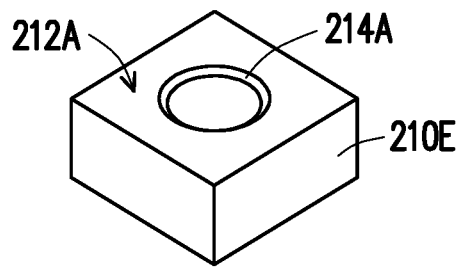
Figure 6F:
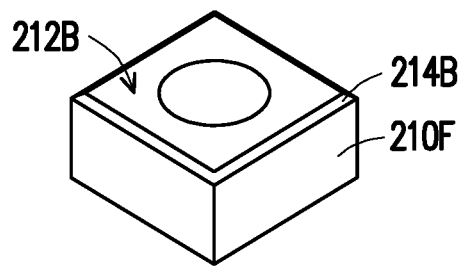
Figure 6G:
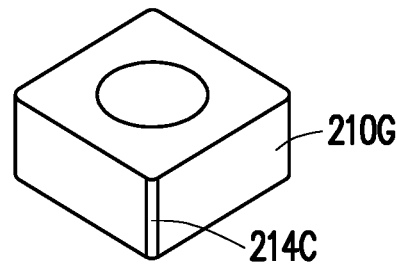
Figure 6H:
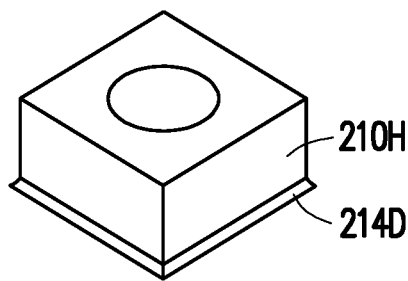
Figure 6I:
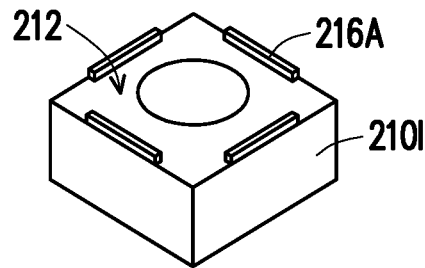
Figure 6J:
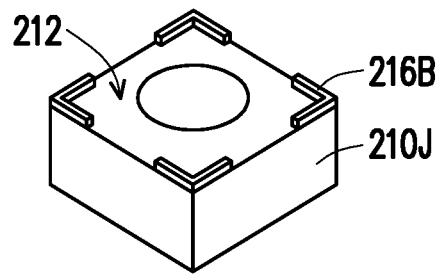
Figure 6K:
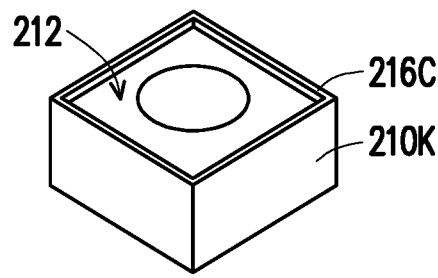

Referring to FIGS. 6I to 6L, in different embodiments, the platform has at least one limiting portion protruded from the cavy surface 212, and at least one limiting portion is located at the outer edge of the carry surface 212. For example, a platform 210I may have four limiting portions 216A at the center of the outer edge of the carry surface 212 as shown in FIG. 6I. Alternatively, a platform 210J may have four limiting portions 216B at the boundary of respective adjacent outer edge of the carry surface 212 as shown in FIG. 6J. Alternatively, a platform 210K may have a ring-shaped limiting portion 216C at the outer edge of the carry surface 212 as shown in FIG. 6K. In the embodiments, the height of the limiting portions 216A, 216B and 216C is smaller than the thickness of the elements (e.g., elements 25 of FIG. 5). The width of the limiting portions 216A, 216B and 216C is smaller than half of the difference between the size of the carry surface and the size of the element.

Figure 6L:
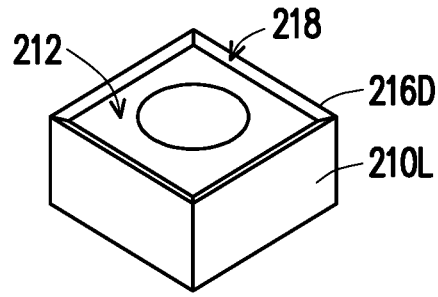
Figure 7A:
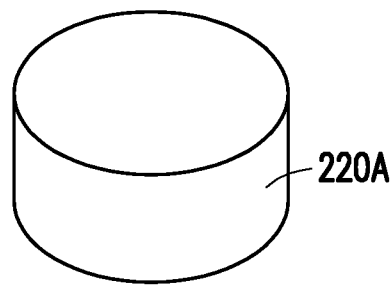
FIGS. 7A to 7H are schematic views illustrating supporting pillars in different embodiments.
Figure 7B:
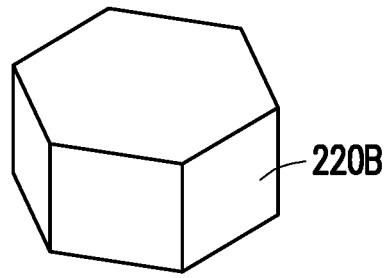
Figure 7C:
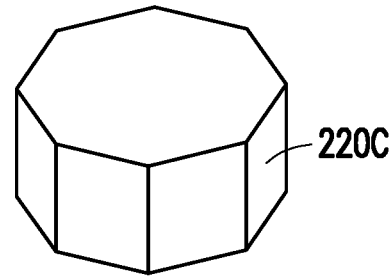
Figure 7D:
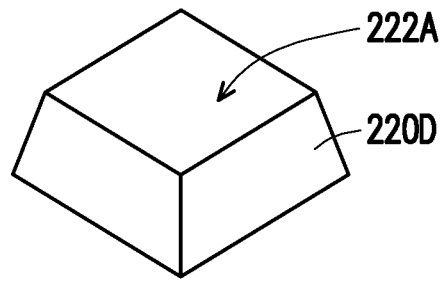
Figure 7E:
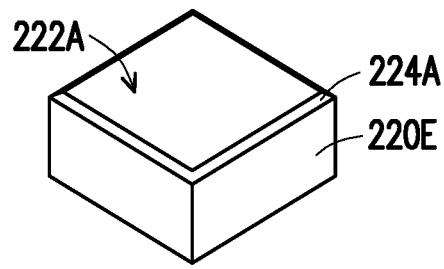
Figure 7F:
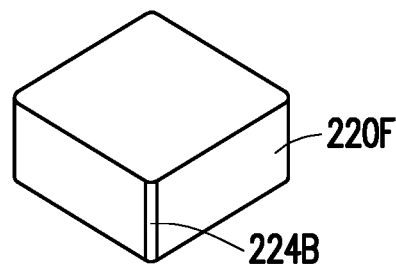
Figure 7G:
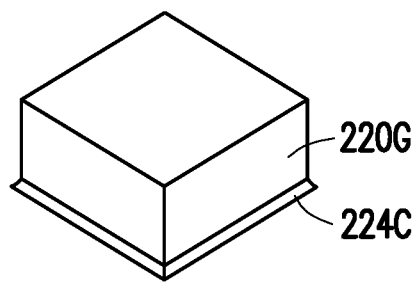
Figure 7H:
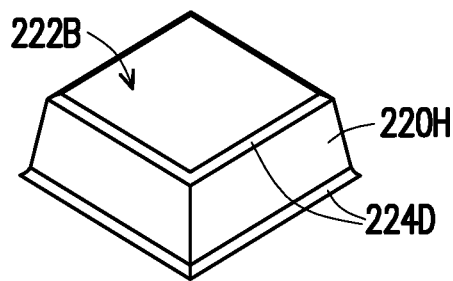

It should be mentioned that, in other embodiments, a platform 210L may have a ring-shaped limiting portion 216D at the outer edge of the carry surface 212, and the limiting portion 216D has a tapered surface 218. Specifically, an angle between the tapered surface 218 and the carry surface 212 is an obtuse angle. Therefore, when the transfer support 200 is in contact with the elements 25, the elements 25 may further move along the corresponding tapered surface 218 and contact the carry surface 212 as shown in FIG. 6L. In summary, different types of limiting portions may be used in different embodiments, which should not be construed as a limitation to the disclosure.

FIGS. 7A to 7H are schematic views of supporting pillars in different embodiments. Referring to FIGS. 7A to 7D first, in different embodiments, the supporting pillar may be selected from a cylindrical supporting pillar 220A illustrated in FIG. 7A, a polygonal supporting pillar 220B, 220C or a trapezoid supporting pillar 220D. In other words, the supporting pillar 220 in the transfer support 200 of the disclosure may be formed to have different shapes to provide rigid support to the vacuum apparatus and enhance the mechanical strength thereof, which should not be construed as a limitation to the disclosure.

Referring to FIGS. 7E to 7H, in different embodiments, the supporting pillar may have an arc-shaped structure at the edge of the supporting pillar. The position of the arc-shaped structure may be at the edge of a supporting surface 222A of the supporting pillar 220E (as the arc-shaped structure 224A illustrated in FIG. 7E), a corner between the side walls of a supporting pillar 220F (as the arc-shaped structure 224B illustrated in FIG. 7F), a boundary between a supporting pillar 220G and the second surface S2 (as the arc-shaped structure 224C illustrated in FIG. 7G), or an edge of a supporting surface 220B of the supporting pillar 220H and the boundary between the supporting pillar 220H and the second surface S2 (as the arc-shaped structure 224D illustrated in FIG. 7H), which should not be constructed as a limitation to the disclosure. In this manner, a stress generated between the supporting pillars 220E, 220F, 220G, 220H and the vacuum apparatus 100 may be reduced when the transfer module 50 transfers the elements 25.

Figure 8A:
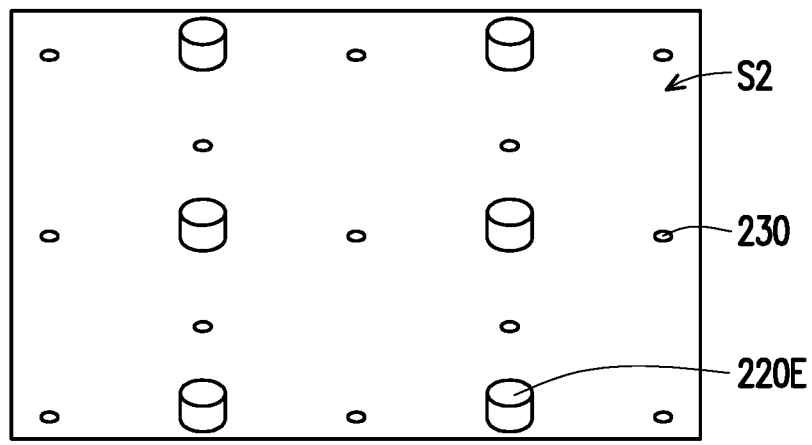
FIGS. 8A to 8C are schematic views illustrating different distributions of the supporting pillar in recess according to different embodiments.
Figure 8B:
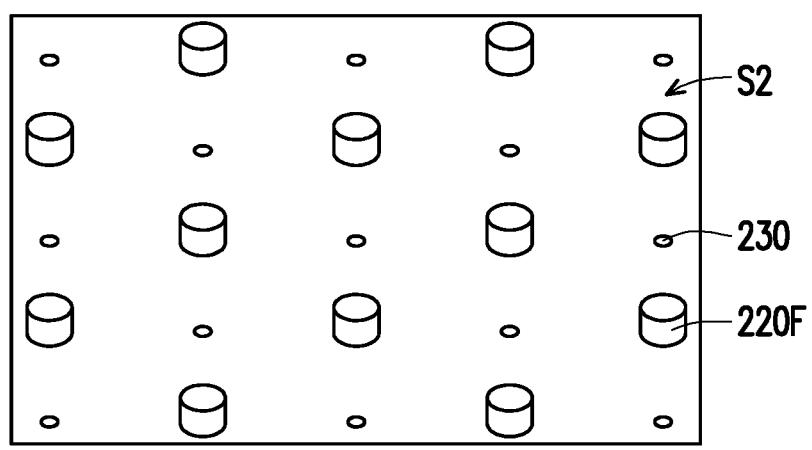
Figure 8C:
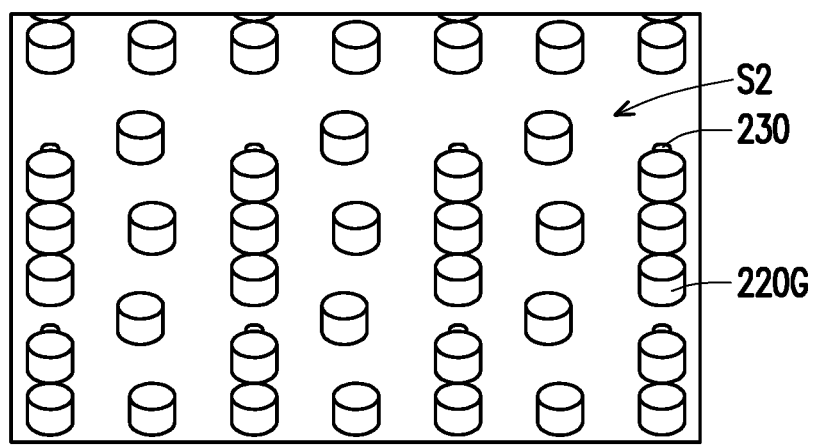

FIGS. 8A to 8C are schematic views illustrating different distributions of the supporting pillar in recess according to different embodiments. Referring to FIGS. 8A to 8C, in different embodiments, the supporting pillar on the second surface S2 in the transfer support 200 may have different distribution density. For example, there may be a few number of supporting pillars 220E distributed in the range covered by the plurality of through holes 230 as shown in FIG. 8A. Alternatively, there may be one supporting pillar 220F distributed in the range surround by four of adjacent through holes 230 as shown in FIG. 8B. Alternatively, there may be at least two supporting pillars 220G distributed in the range surrounded by four through holes 230 as shown in FIG. 8C, which should not be construed as a limitation to the disclosure.

Figure 9A:
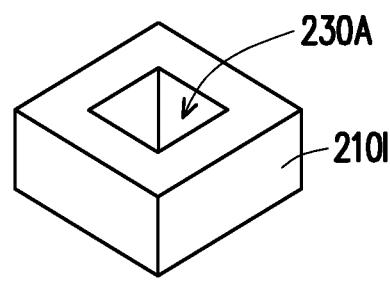
FIGS. 9A to 9E are schematic views illustrating through holes in different embodiments.
Figure 9B:
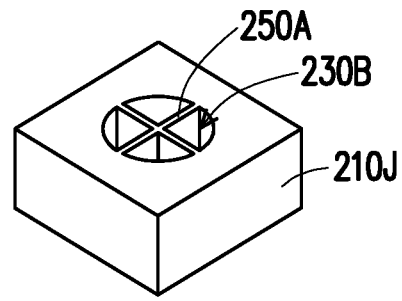
Figure 9C:
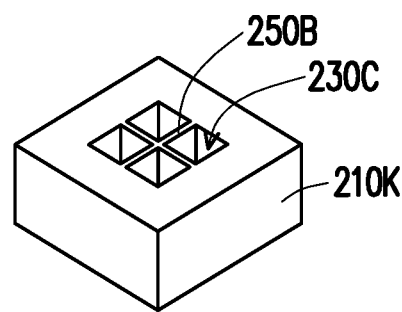

FIGS. 9A to 9E are schematic views of through holes in different embodiments. Referring to FIG. 9A first, in the embodiment, the through hole 230A may be a square columnar through hole; in other embodiments, the through hole may be in other shapes, which should not be construed as a limitation to the disclosure. Referring to FIGS. 9B and 9C, in different embodiments, the transfer support 200 further includes a plurality of rigid supports 250A, 250B. The rigid supports 250A and 250B are disposed in one of the through holes 230B and 230C. In some embodiments, each of the rigid supports 250A and 250B are respectively disposed in one of the through holes 230B and 230C. In some alternative embodiments, only parts of the rigid supports 250A and 250B satisfy the above-described condition. For example, in other embodiments, the transfer support 200 may include a cross-shaped rigid support 250 in the cylindrical through hole 230B. In other embodiment, the transfer support 200 may include a cross-shaped rigid support 250B that is formed in the square columnar through hole 230C. In this manner, when the elements 25 are attracted, a rigid supporting force can be provided to the elements 25, thereby efficiently transferring the elements 25 to the target substrate.

Figure 9D:
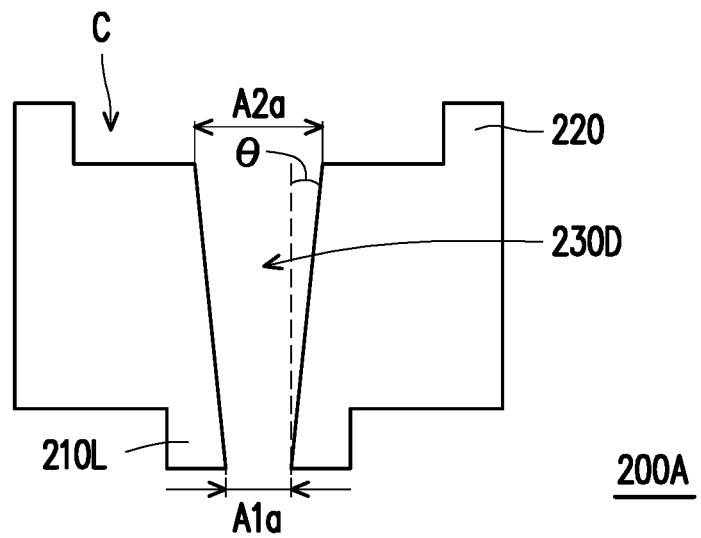
Figure 9E:
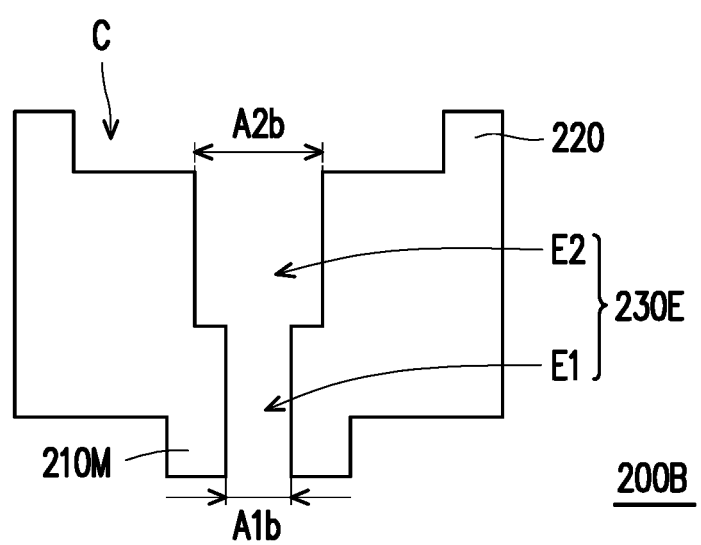

Referring to FIGS. 9D and 9E, in different embodiments, the through holes with different apertures may be selected for use in the transfer support. For example, the through hole 230D in the transfer support 200A may be a cone-shaped through hole, and the aperture of the through hole 230D increases along a direction from the carry surface 212 to the recess C. Specifically, an aperture A2$a$ of a pumping terminal of the through hole 230D is larger than an aperture A1$a$ of the attraction terminal, and the aperture increases from the attraction terminal to the pumping terminal gradually. In other words, an angle θ is formed between a direction along which an opening of the attraction terminal extends perpendicularly to the recess C and a direction along which the opening of the attraction terminal extends to an opening of the pumping terminal. The angle θ is, for example, smaller than 15 degrees and larger than 0 degree. Preferably, the angle θ may be smaller than 10 degrees and larger than 0 degree. In another embodiment, the through hole 230E in the transfer support 200B has a plurality of columnar spaces E1 and E2 having different apertures and communicating with each other. Moreover, the columnar space E2 with a larger aperture (i.e., aperture A2$b$) is disposed between the columnar space E1 with a smaller aperture (i.e., aperture A1$b$) and the recess C as shown in FIG. 9E. In other words, the through hole 230E is an etched through hole in step shape. In this manner, the vacuum force for attracting the elements 25 can be adjusted via the through hole of different types of columnar spaces.

Figure 10:
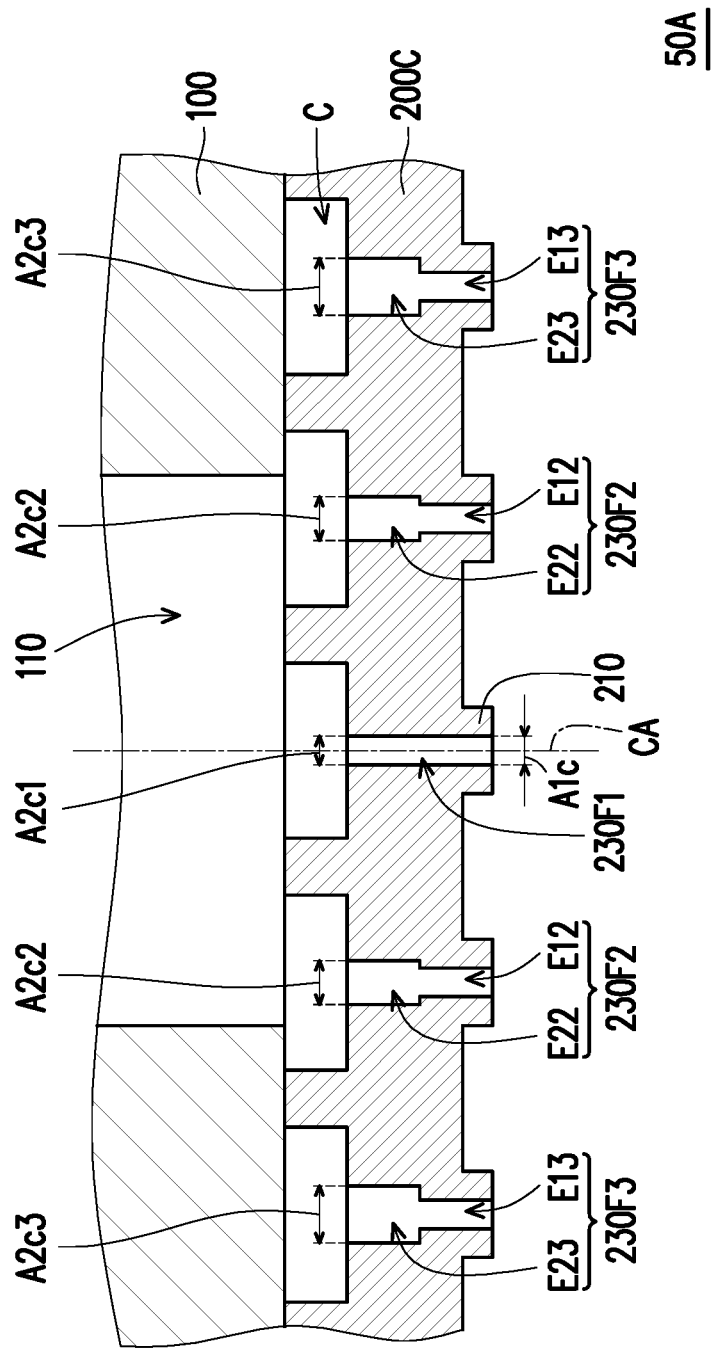
FIG. 10 is a cross-sectional view of a transfer module according to another embodiment of the disclosure.

FIG. 10 is a cross-sectional view of a transfer module according to another embodiment of the disclosure. Referring to FIG. 10, a transfer module 50A of the embodiment is similar to the transfer module 50 of FIG. 2 except that a transfer support 200C in this embodiment has a plurality of thorough holes 230F1, 230F2, 230F3, and the volume of the through holes 230F1, 230F2, 230F3 may be different from one another. For example, a volume of the through hole 230F1, 230F2 or 230F3 is positive correlated to a distance from the center of the recess C (i.e., the central axis CA of the recess C) to said through hole 230F1, 230F2 or 230F3. The distance from the central axis CA of the recess C to the through hole 230F2 is greater than the distance from the central axis CA of the recess C to the through hole 230F1, and the volume of the through hole 230F2 is greater than the volume of the through hole 230F1. Similarly, the distance from the central axis CA of the recess C to the through hole 230F3 is greater than the distance from the central axis CA of the recess C to the through hole 230F2, and the volume of the through hole 230F3 is greater than the volume of the through hole 230F2. The greater the distances (i.e. the distance to the central axis CA od the recess C) from the through holes 230F1, 230F2, 230F3 to the center of the recess C, the greater is the aperture differences of the columnar spaces of the through holes 230F1, 230F2, 230F3.

Specifically, an aperture A2$c$1 of the pumping terminal of the through hole 230F1 disposed at the center of the recess C is the same as an aperture A1$c$ of the attraction terminal; that is, the through hole 230F1 is a single columnar space. The through hole 230F2 adjacent to through holes 230F1 has two columnar spaces E12 and E22 having different apertures (i.e. apertures A1$c$ and A2$c$2) and communicating with each other. The columnar space E22 with a lager aperture A2$c$2 is disposed between the columnar space E12 with a smaller aperture A1$c$ and the recess C. Since the distance between the through hole 230F2 and the center axis CA of the recess C is larger than the distance between the through hole 230F1 and the center axis CA of the recess C, the aperture difference (i.e., aperture difference between aperture A2$c$2 and aperture A1$c$) of the columnar space of the through hole 230F2 is larger than the aperture difference (i.e., aperture difference between aperture A2$c$1 and aperture A1$c$) of the columnar space of the through hole 230F1.

The through hole 230F3 adjacent to the through hole 230F2 and away from the center axis CA of the recess C has two columnar spaces E13 and E23 having different apertures (i.e. apertures A1$c$ and A2$c$3) and communicating with each other. The columnar space E23 with a larger aperture A2$c$3 is disposed between the columnar space E13 with a smaller aperture A1$c$ and the recess C. Since the distance between the through hole 230F3 and the center axis CA of the recess C is larger than the distance between the through hole 230F2 and the center axis CA of the recess C, the aperture difference (i.e., aperture difference between aperture A2$c$3 and aperture A1$c$) of the columnar space of through hole 230F3 is larger than the aperture difference (i.e., aperture difference between aperture A2$c$2 and aperture A1$c$) of the columnar space of through hole 230F2. In this manner, the attraction force of the platform 210 farther from the center axis CA of the recess C can be increased, allowing the attraction force of the plurality of the platforms 210 of the transfer module 50A to be distributed more evenly.

Figure 11:
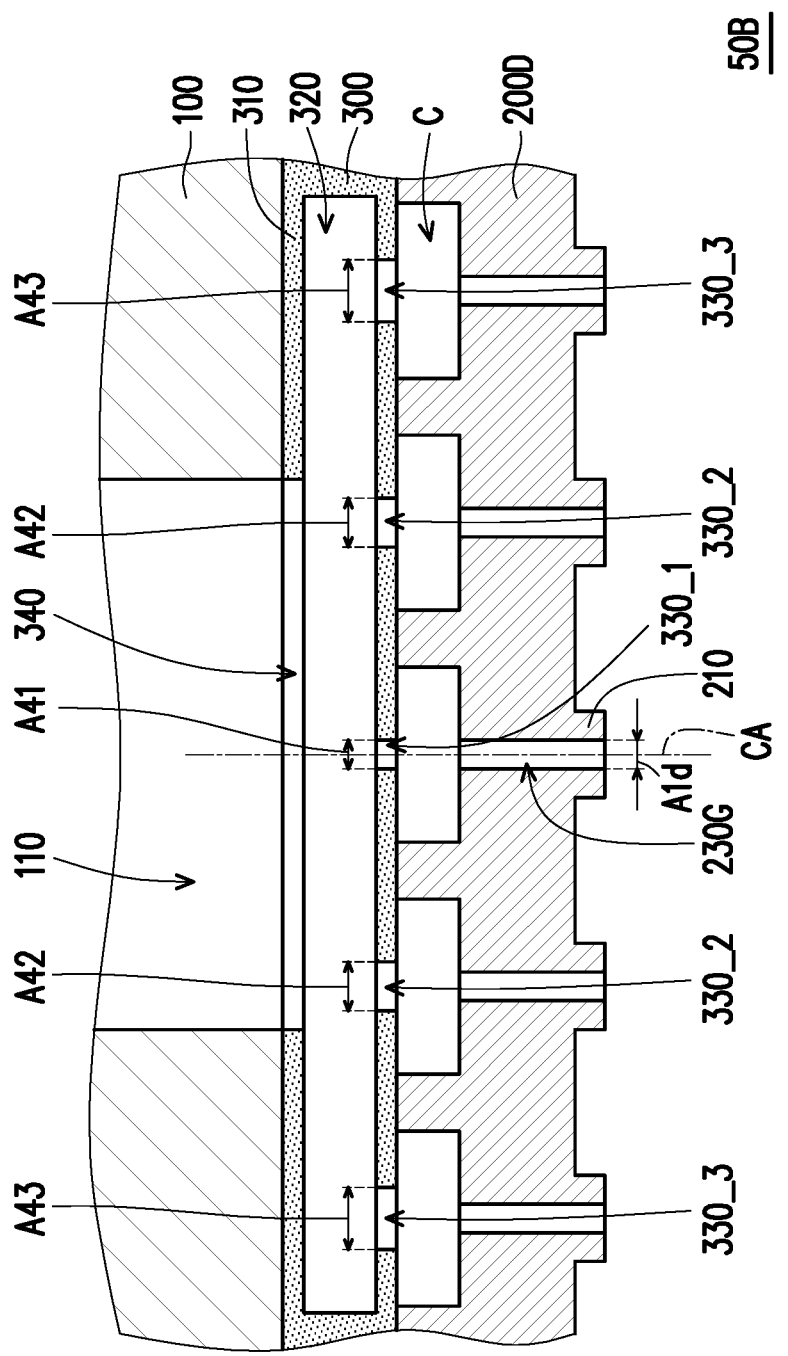
FIG. 11 is a cross-sectional view of a transfer module according to another embodiment of the disclosure.

FIG. 11 is a cross-sectional schematic view of a transfer module according to another embodiment of the disclosure. Referring to FIG. 11, a transfer module 50B in the embodiment is similar to the transfer module 50 in FIG. 2 except that the transfer module 50B of this embodiment further includes an attraction adjusting member 300 disposed between a transfer support 200D and the vacuum apparatus 100. The attraction adjusting member 300 has an outer frame 310 and a cavity 320 defined in the outer frame 310. The outer frame 310 has a plurality of first openings 330_1, 330_2, 330_3 and a second opening 340, wherein the first openings 330_1, 330_2, 330_3 and the second opening 340 are located on two opposite sides of the cavity 320 respectively. The first openings 330_1, 330_2 and 330_3 respectively commutate with one of the plurality of through holes 230G. The second opening 340 communicate with the exhausting vent 110. The aperture size of the first openings 330_1, 330_2 and 330_3 may be different from one another. For example, the aperture size of the first opening 330_1, 330_2 or 330_3 is positive correlated to a distance from the central axis CA of the recess C to said opening 330_1, 330_2 or 330_3. The distance from the central axis CA of the recess C to the opening 330_2 is greater than the distance from the central axis CA of the recess C to the opening 330_1, and the aperture size of the opening 330_2 is greater than the aperture size of the opening 330_1. Similarly, the distance from the central axis CA of the recess C to the opening 330_3 is greater than the distance from the central axis CA of the recess C to the opening 330_2, and the aperture size of the opening 330_3 is greater than the aperture size of the opening 330_2. In other words, a first portion of the first openings 330_1, 330_2 or 330_3 has a first aperture size and a second portion of the first openings 330_1, 330_2 or 330_3 has a second aperture size greater than the first aperture size, and a first distance from a center (i.e. the central axis CA) of the recess C to the first portion of the first openings 330_1, 330_2 or 330_3 is smaller than a second distance from the center of the recess C to the second portion of the first openings 330_1, 330_2 or 330_3. The greater the distances (i.e. the distance to the central axis CA od the recess C) from the first openings 330_1, 330_2, and 330_3 to the center of the recess C, the greater is the aperture sizes of the first openings 330_1, 330_2, and 330_3.

Specifically, an aperture A41 of the first opening 330_1 located at the center of the recess C is the same as an aperture A1$d$ of the through hole 230G. The first opening 330_2 adjacent to the first opening 330_1 has an aperture A42 larger than the aperture A41 of the first opening 330_1. The first opening 330_3 adjacent to the first opening 330_2 and away from the center of the recess C has an aperture A43 larger than the aperture A42 of the first opening 330_2. In this manner, the attraction force of the platform 210 farther from the center axis CA of the recess C can be increased, allowing the attraction force of the plurality of the platforms 210 of the transfer module 50B to be distributed more evenly.

Figure 12:
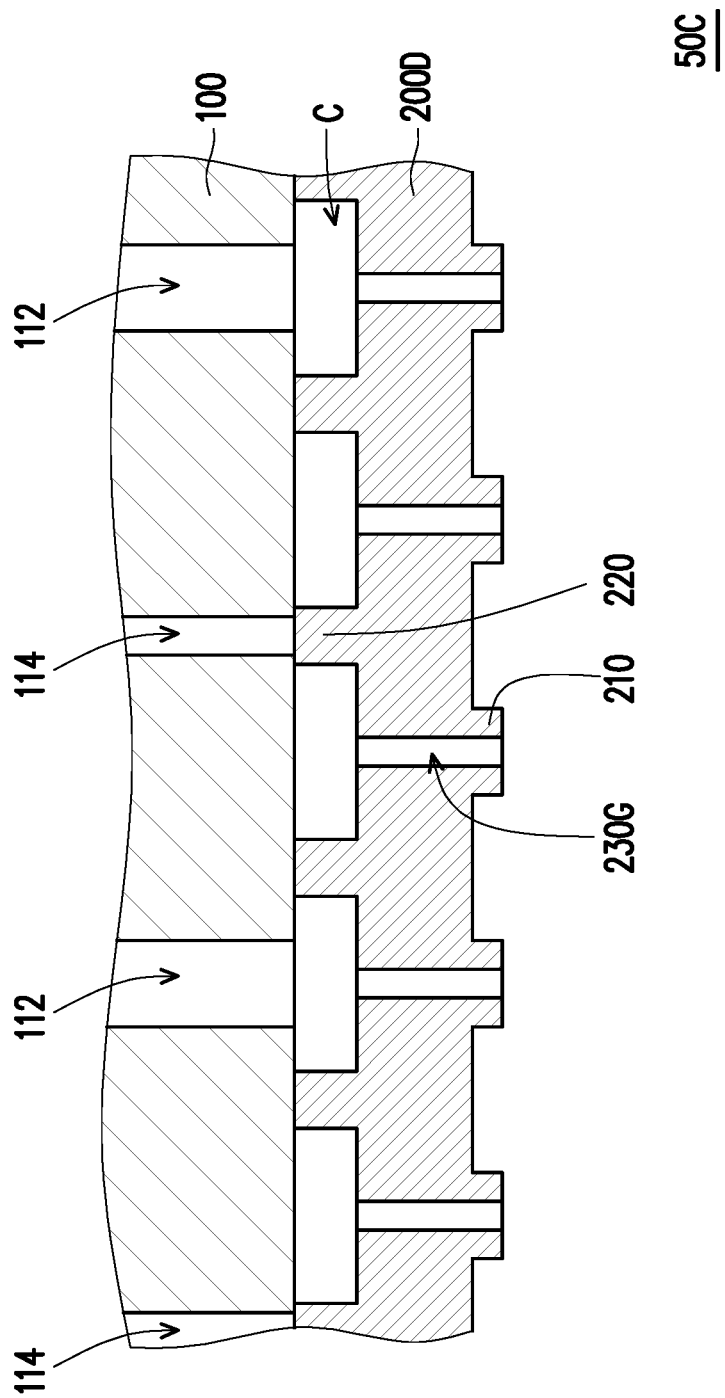
FIG. 12 is a cross-sectional view of a transfer module according to another embodiment of the disclosure.

FIG. 12 is a cross-sectional schematic view of a transfer module according to another embodiment of the disclosure. Referring to FIG. 12, a transfer module 50C in the embodiment is similar to the transfer module 50 in FIG. 2 except that the exhausting vent 110 of this embodiment further includes a plurality of first exhausting vents 112 and a plurality of second exhausting vents 114. The first exhausting vents 112 communicate with a plurality of through holes 230G. The second exhausting vents 114 abut against the supporting pillar 220 to attract the transfer support 200. In this manner, the stability of the transfer support 200 abutting against the vacuum apparatus 100 can be enhanced. In other embodiments, the number and sequence of configuration of the first exhausting vents 112 and the second exhausting vents 114 may vary depending on the needs, which should not be construed as a limitation to the disclosure.

Figure 13:
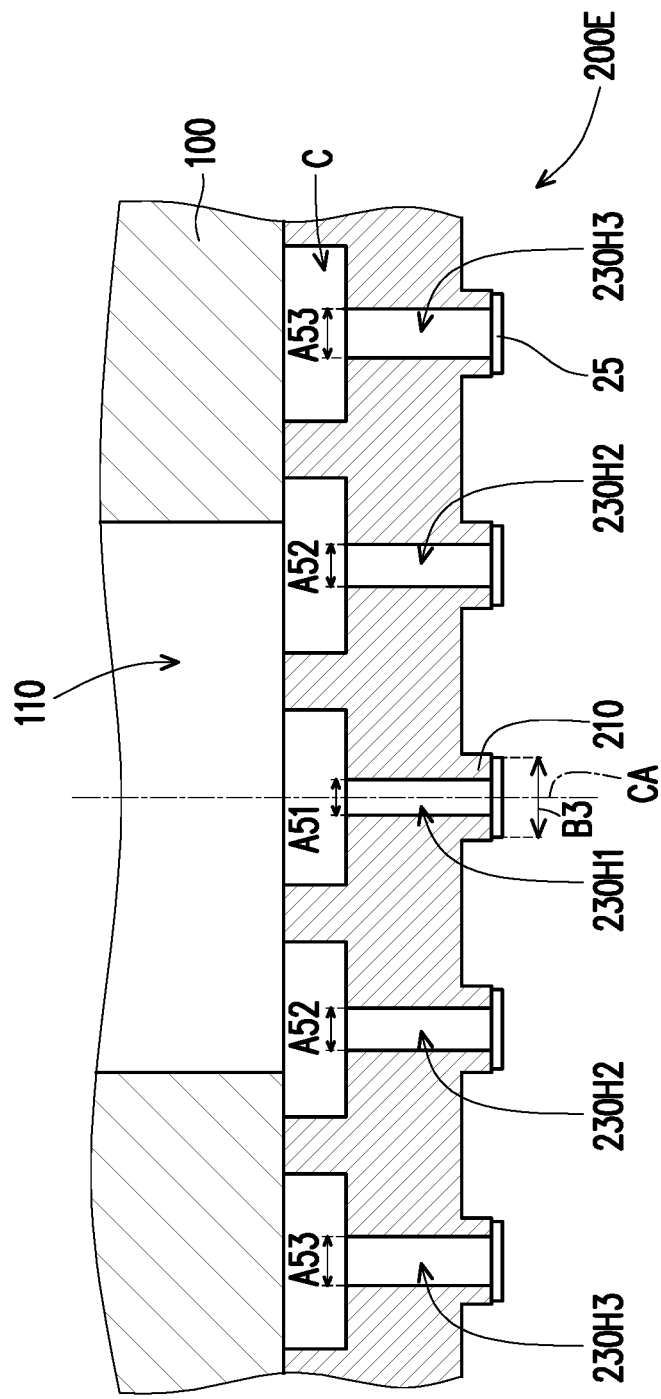
FIG. 13 is a partial cross-sectional view illustrating a transfer module according to another embodiment of the disclosure.

FIG. 13 is a partial cross-sectional view of a transfer module according to another embodiment of the disclosure. Referring to FIG. 13, a transfer support 200E in the embodiment is similar to the transfer support 200C in FIG. 10 except that, in the transfer support 200E in this embodiment, each one of a plurality of through holes 203H1, 230H2 and 230H3 is a single columnar space respectively. Apertures A51, A52 and A53 of the through holes 230H1, 230H2 and 230H3 are different from one another. For example, the aperture A51, A52 or A53 of the through hole 230H1, 230H2 or 230H3 is positive correlated to a distance from the central axis CA of the recess C to said through hole 230H1, 230H2 or 230H3. The distance from the central axis CA of the recess C to the through hole 230H2 is greater than the distance from the central axis CA of the recess C to the through hole 230H1, and the aperture size or volume of the through hole 230H2 is greater than the aperture size or volume of the through hole 230H1. Similarly, the distance from the central axis CA of the recess C to the through hole 230H3 is greater than the distance from the central axis CA of the recess C to the through hole 230H2, and the aperture size or volume of the through hole 230H3 is greater than the aperture size or volume of the through hole 230H2. The greater the distances (i.e. the distance to the central axis CA od the recess C) from the through holes 230H1, 230H2, 230H3 to the center of the recess C, the greater is the aperture differences of the columnar spaces of the through holes 230H1, 230H2, 230H3. The largest aperture does not exceed two-third of the size B3 of the elements 25. In other embodiment, the plurality of through holes 230H1, 230H2, 230H3 in the transfer support 200E may directly communicate with the second surface S2, which should not be construed as a limitation to the disclosure.

Figure 14:
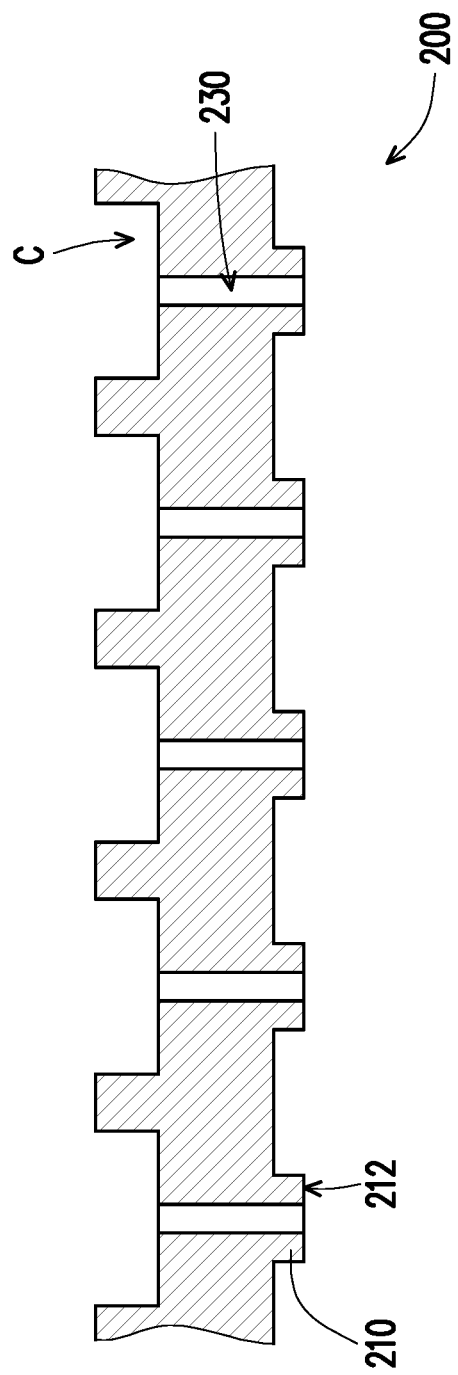
FIG. 14 is a cross-sectional view illustrating a transfer support according to an embodiment of the disclosure.

FIG. 14 is a cross-sectional view illustrating a transfer support according to an embodiment of the disclosure. Referring to FIG. 14, a transfer support 200 in the embodiment is similar to the transfer support 200 in FIG. 5 except that the hardness of at least one portion of the platform 210 of the transfer support 200 in the embodiment in contact with the element 25 (e.g., see FIG. 5) is greater than the hardness of an element to be attracted. The hardness may be classified according to Mohs scale of mineral hardness, Vickers hardness, Rockwell hardness or Brinell hardness depending on the material, which should not be construed as a limitation to the disclosure. Specifically, in the embodiment, the at least one portion of the transfer support 200 in contact with the element to be attracted is formed of a material having greater hardness than the element to be attracted, such as silicon nitride ($SiN_x$), silicon oxide ($SiO_x$), titanium dioxide ($TiO_2$), gold (Au), titanium (Ti), tungsten (W), diamond like carbon (DLC), diamond, aluminum oxide ($Al_2O_3$) or other material having greater hardness than the element to be attracted.

Since the at least one portion of the transfer support 200 in contact with the element to be attracted is formed of a material having greater hardness, when the transfer module uses the transfer support 200 to attract element, it can be prevented that the platform 210 is damaged due to contact and pressure in the process that the transfer support 200 attracts element. Additionally, in the embodiment, the degree of warpage of the transfer support 200 may be less than or equal to 1 μm. In this manner, the durability of the transfer support 200 and accuracy of transferring element may be further improved. In some embodiments, the overall transfer support 200 may be formed of a material having greater hardness than the element to be attracted, the disclosure provides no limitation thereto.

Figure 15:
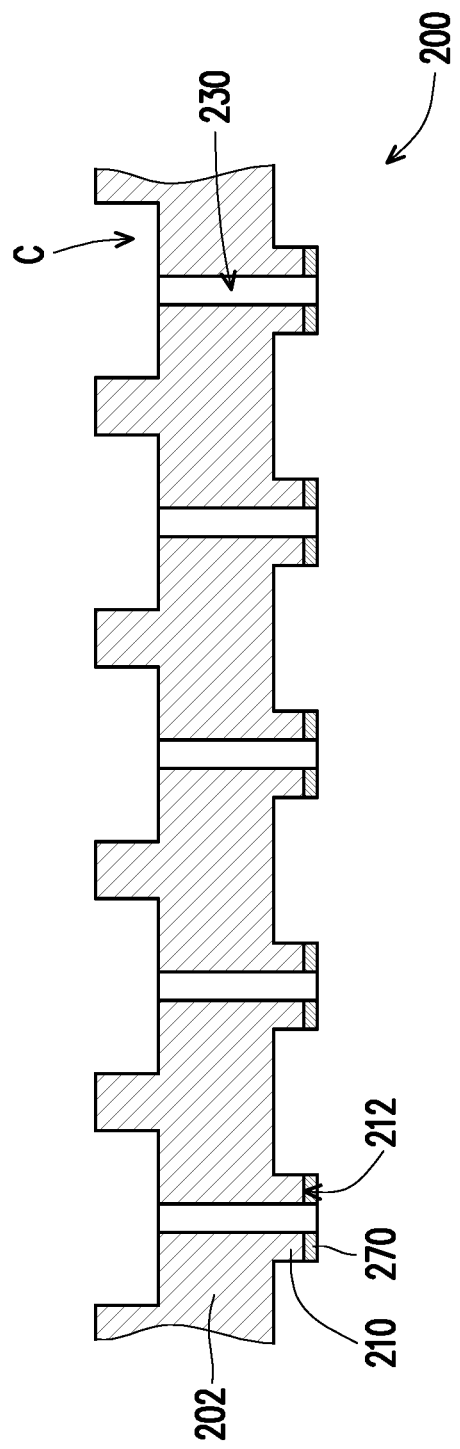
FIG. 15 is a cross-sectional view illustrating a transfer support according to another embodiment of the disclosure.

FIG. 15 is a cross-sectional view illustrating a transfer support according to another embodiment of the disclosure. Referring to FIG. 15, the transfer support 200 in the embodiment is similar to the transfer support 200 in FIG. 14 except that the transfer support 200 in the embodiment further includes a plurality of protective patterns 270 respectively disposed on the carry surface 212. The protective patterns 270 are not connected with each other, and the hardness of the protective patterns is greater than the hardness of the element to be transferred. Specifically, in the embodiment, the transfer support 200 includes a substrate 202 and the plurality of protective patterns 270 disposed on the carry surface 212 of the substrate 202, and the hardness of the protective patterns 270 is greater than the hardness of the element to be transferred. In this manner, when the transfer module uses the transfer support 200 to attract element, the protective patterns 270 may be used to prevent the platform 210 from being damaged due to contact and pressure generated in the process that the transfer support 200 attracts element. The protective patterns 270 may be formed of diamond like carbon, diamond, aluminum oxide, silicon nitride, silicon oxide or titanium dioxide, and the substrate 202 may be formed of silicon (Si), silicon carbide (SiC), aluminum nitride (AlN) or ceramics, which should not be construed as a limitation to the disclosure. Moreover, in the embodiment, the degree of warpage of the transfer support 200 may be less than or equal to 1 μm.

Figure 16A:
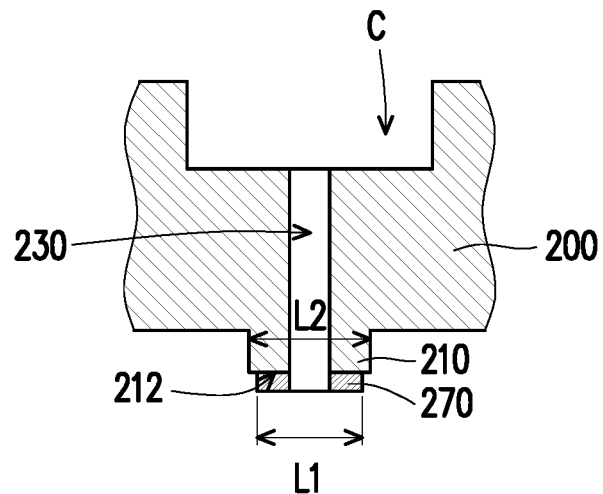
FIG. 16A-FIG. 16E are schematic views illustrating platforms in different embodiments.
Figure 16B:
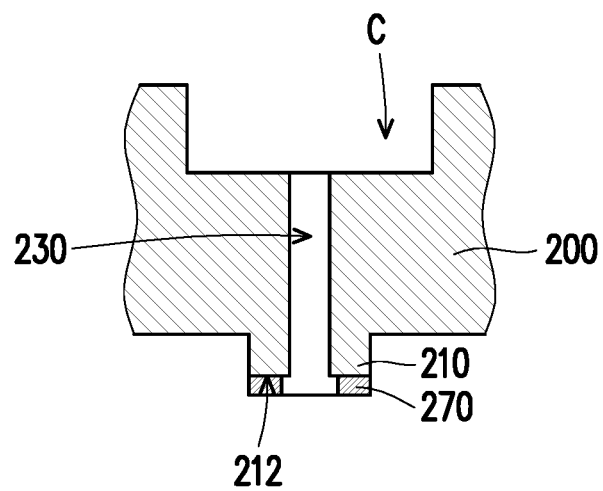

FIG. 16A-FIG. 16E are schematic views illustrating platforms in different embodiments. Referring to FIG. 16A and FIG. 16B, the protective patterns 270 in the embodiment is similar to the protective patterns 270 in FIG. 15 except that the protective patterns 270 in the embodiment at least partially cover the carry surface 212. In other words, the protective patterns 270 do not necessarily completely cover the carry surface 212, and thus saving more material and also preventing the platform 210 from being damaged due to contact and pressure generated in the process that the transfer support 200 attracts element. In an embodiment, the protective patterns 270 may be configured in alignment with the through holes 230 such that an outer diameter L1 of the protective patterns 270 is smaller than an outer diameter L2 of the platform 210 as shown in FIG. 16A. In another embodiment, the protective patterns 270 may be configured in alignment with the outer wall of the platform 210 as shown in FIG. 16B, which should not be construed as a limitation to the disclosure.

Figure 16C:
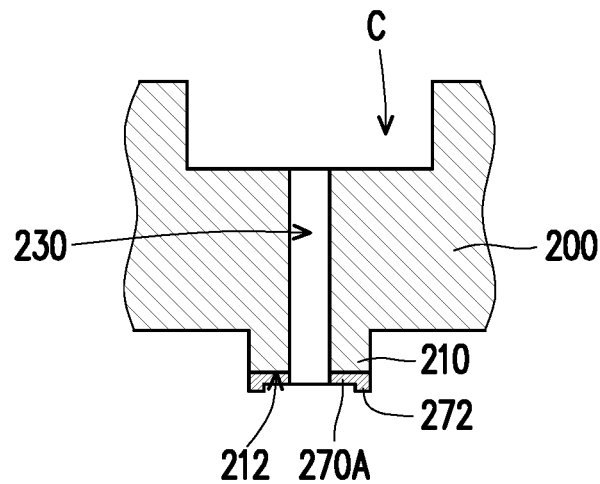

In an embodiment, protective patterns 270A have at least one protruded limiting portion 272, and the limiting portion 272 surrounds the protective patterns 270A as shown in FIG. 16C. Specifically, in the embodiment, the height of the limiting portion 272 is smaller than the thickness of the element to be attracted, and the width of the limiting portion 272 is smaller than half of the difference between the size of the carry surface 212 and the size of the element to be attracted. In this manner, in the process that the transfer support 200 attracts element, the protective patterns 270A may be brought into contact with the element to be attracted and the element can be limited in the limiting portion 272, thereby preventing transfer misalignment or transfer deviation. In different embodiments, different types of limiting portions may be selected to limit the element to be attracted, which should not be construed as a limitation to the disclosure.

Figure 16D:
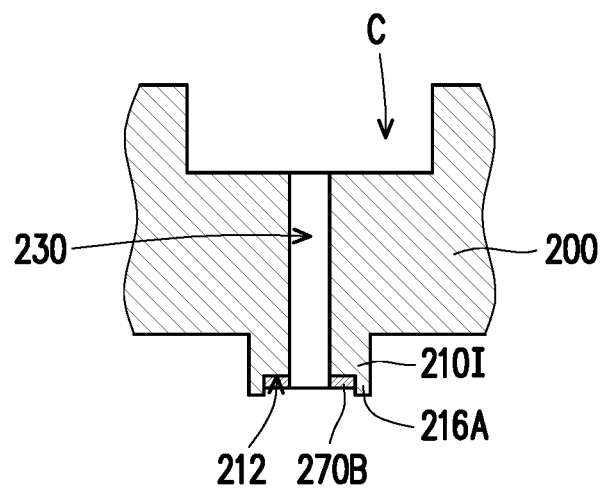
Figure 16E:
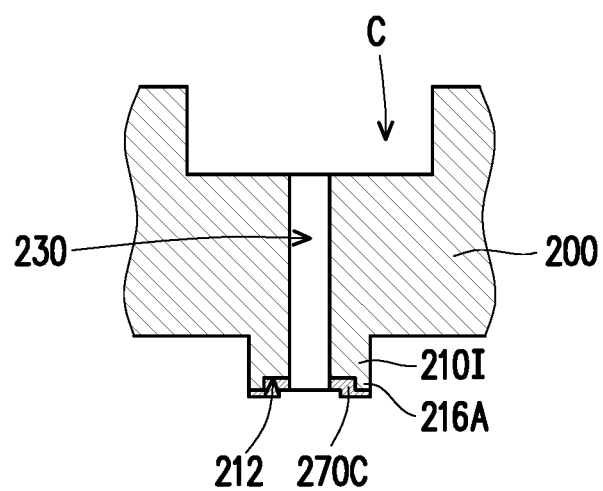

In an embodiment, a platform 210I has at least one limiting portion 216A protruded from the carry surface 212, and the limiting portion 216A is disposed at the outer edge of the carry surface 212. Additionally, in the embodiment, the transfer support 200 further includes a plurality of protective patterns 270B respectively disposed on the carry surface 212. The protective patterns 270B are not connected with each other, and the hardness of the protective patterns 270B is greater than the hardness of the element to be attracted as shown in FIG. 16D. In another embodiment, protective patterns 270C may further cover the limiting portion 216A to achieve a better protecting effect as shown in FIG. 16E. Therefore, in the process that the transfer support 200 attracts element, the protective patterns 270B and 270C may be brought into contact with the element to be attracted so as to limit the element in the limiting portion 216A, thereby preventing transfer misalignment or transfer deviation.

Figure 17:
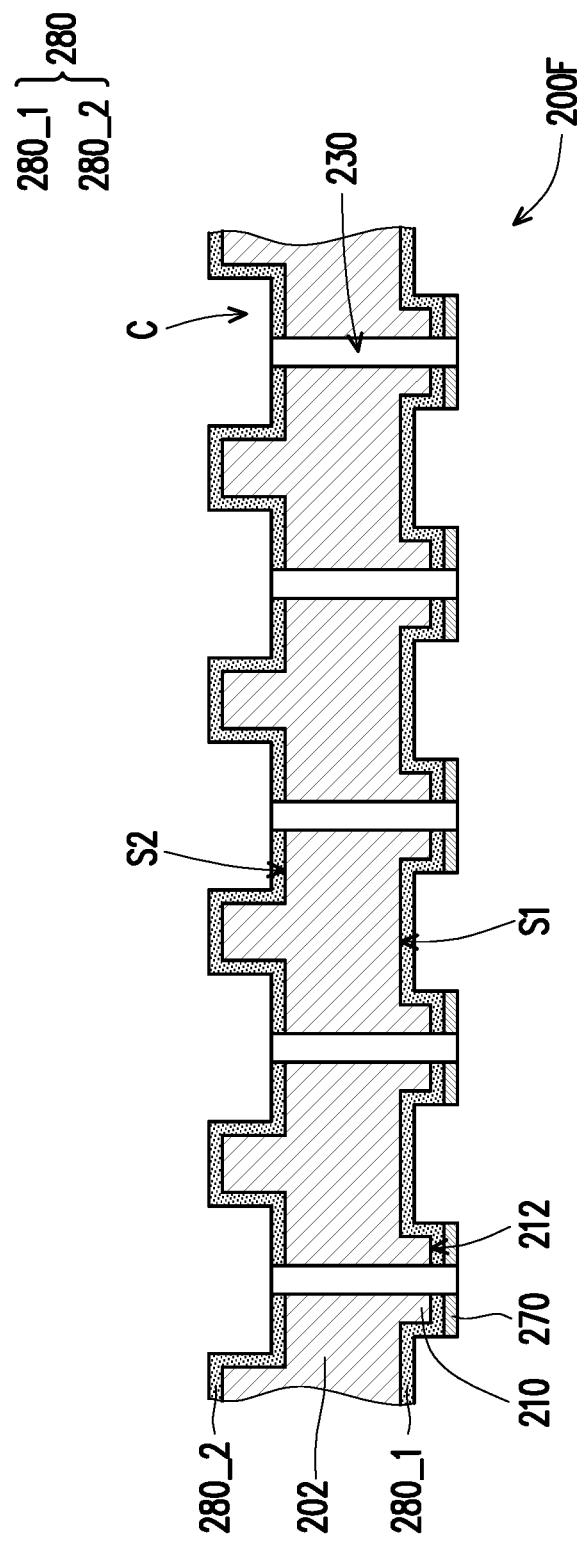
FIG. 17 is a cross-sectional view illustrating a transfer support according to another embodiment of the disclosure.

FIG. 17 is a cross-sectional view illustrating a transfer support according to another embodiment of the disclosure. Referring to FIG. 17, a transfer support 200F in the embodiment is similar to the transfer support 200 in FIG. 15 except that the transfer support 200F in the embodiment further includes an anti-bending layer 280 disposed on at least one of a first surface S1 or a second surface S2. Specifically, in the embodiment, the anti-bending layer 280 includes a first anti-bending layer 280_1 and a second anti-bending layer 280_2, wherein the first anti-bending layer 280_1 and the second anti-bending layer 280_2 are respectively disposed on the first surface S1 and the second surface S2. In this manner, the anti-bending layer 280 may be used to further enable the overall stress of the transfer support 200F to be balanced, thereby preventing warpage from being generated on the transfer support 200F. In other embodiments, the number of the anti-bending layer 280 may be set as one, and the anti-bending layer 280 may be disposed on the second surface S2, or the number of the anti-bending layer 280 may be set as plural, and the anti-bending layer 280 may be distributed on the first surface S1 and the second surface S2 in an unpaired manner, which should not be construed as a limitation to the disclosure.

Specifically, in some embodiments, the anti-bending layer 280 may be configured in multiple pairs and respectively disposed on the first surface S1 and the second surface S2 to achieve that the hardness or thermal expansion coefficient is balanced on both of the surfaces. Accordingly, the structural strength of the transfer support 200F can be further increased while stress balance can be achieved as well. However, in other embodiments, the anti-bending layer 280 may be matched in an unpaired manner according to the material characteristic of the anti-bending layer 280, which should not be construed as a limitation to the disclosure. In the embodiment, the anti-bending layer 280 may be formed of silicon nitride ($SiN_x$), silicon oxide ($SiO_x$), titanium dioxide ($TiO_2$), gold, (Au), titanium (Ti) or tungsten (W), the disclosure provides no limitation thereto. Additionally, in some embodiments, the protective patterns 270 may serve a bending-resistive function, which should not be construed as a limitation to the disclosure. In the embodiment, the degree of warpage of the transfer support 200 may be less than or equal to 1 μm.

Figure 18:
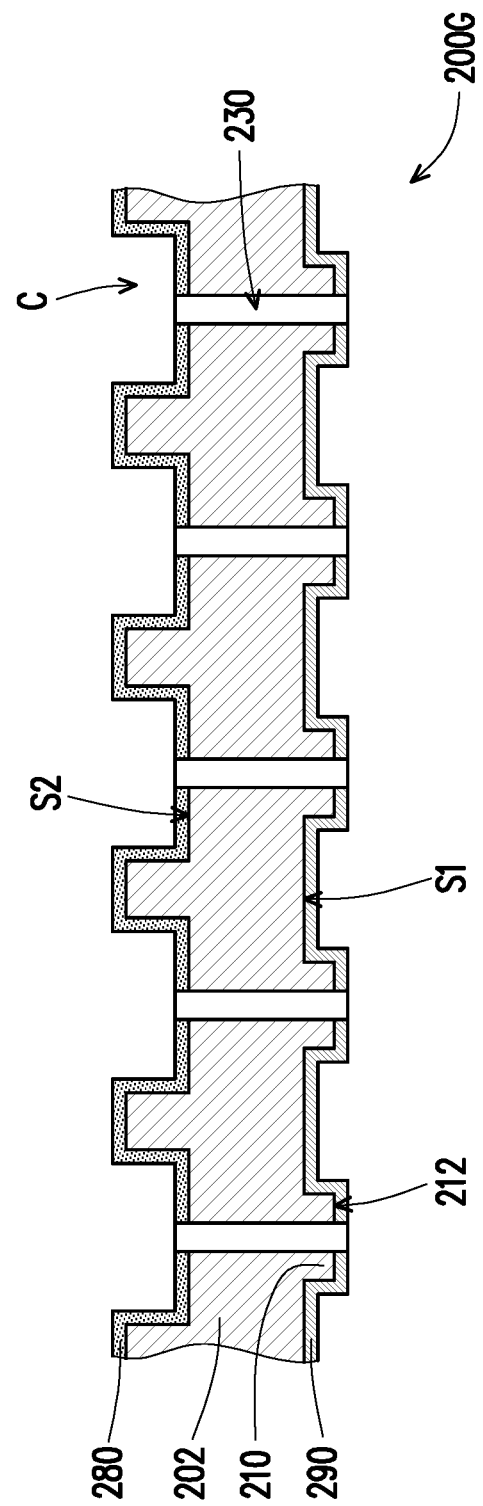
FIG. 18 is a cross-sectional view illustrating a transfer support according to still another embodiment of the disclosure.

FIG. 18 is a cross-sectional view illustrating a transfer support according to still another embodiment of the disclosure. Referring to FIG. 18, a transfer support 200G in the embodiment is similar to the transfer support 200F in FIG. 17 except that the transfer support 200G in the embodiment includes at least one anti-bending layer 280 and at least one protective layer 290. The at least one anti-bending layer 280 is disposed on the second surface S2, the at least one protective layer 290 is disposed on the first surface S1 to protect the platform 210 from being damaged in the process of attracting element. In other words, the protective layer 290 in the embodiment not only provides protecting function but also serves bending-resistive function similar to that of the anti-bending layer 280. Therefore, the anti-bending layer 280 is disposed on one side of the transfer support 200G. In the embodiment, the anti-bending layer 280 and the protecting layer 290 are single-layer structure. However, in other embodiments, a plurality of anti-bending layers 280 or protective layers 290 formed of same or different materials may be used to compensate the stress, which should not be construed as a limitation to the disclosure. With such configuration, in the embodiment, by choosing the materials of anti-bending layer 280 and the protective layer 290 disposed in the transfer support 200, the overall stress of the transfer support 200G can be compensated, thereby further preventing warpage generated on the transfer support 200G. In the embodiment, the degree of warpage of the transfer support 200G may be less than or equal to 1 μm.

In the embodiment, the hardness of the protective layer 290 is greater than the hardness of the element to be attracted. Details of the material for fabricating the protective layer 290 in the embodiment are similar to the material used for fabricating the protective patterns 270 in FIG. 15 except that the protective layer 290 is a single-continuing structure. In this manner, the protective layer 290 may be used to prevent the platform 210 from being damaged due to contact and pressure in the process that the transfer support 200F attracts the element.

Figure 19:
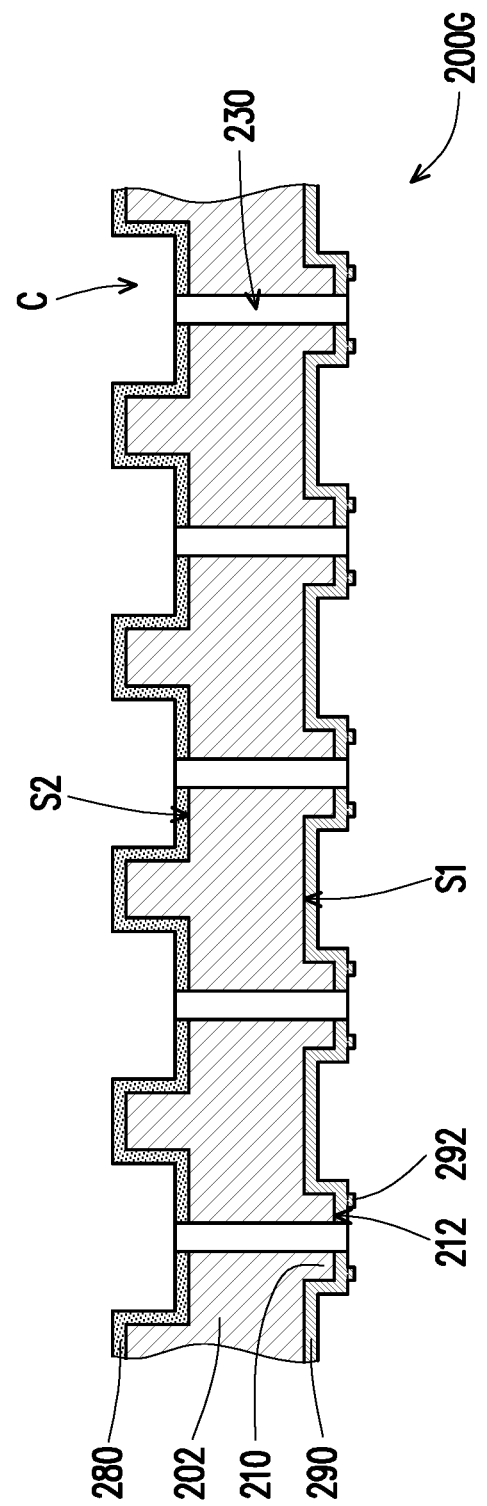
FIG. 19 is a cross-sectional view illustrating a transfer support according to yet another embodiment of the disclosure.

FIG. 19 is a cross-sectional view illustrating a transfer support according to yet another embodiment of the disclosure. Referring to FIG. 19, the transfer support 200G in the embodiment is similar to the transfer support 200G in FIG. 18 except that the protective layer 290 in the embodiment has at least one protruded limiting portion 292, limiting the element to be attracted in the limiting portion 292 while the protective layer 290 is brought into contact with the element, thereby preventing transfer misalignment or transfer deviation, which should not be construed as a limitation to the disclosure. Additionally, in different embodiments, different types of the limiting portions 292 may be selected to limit the element to be attracted, or other material may be used to form the limiting portion 292 additionally, the disclosure provides no limitation thereto.

Figure 20:
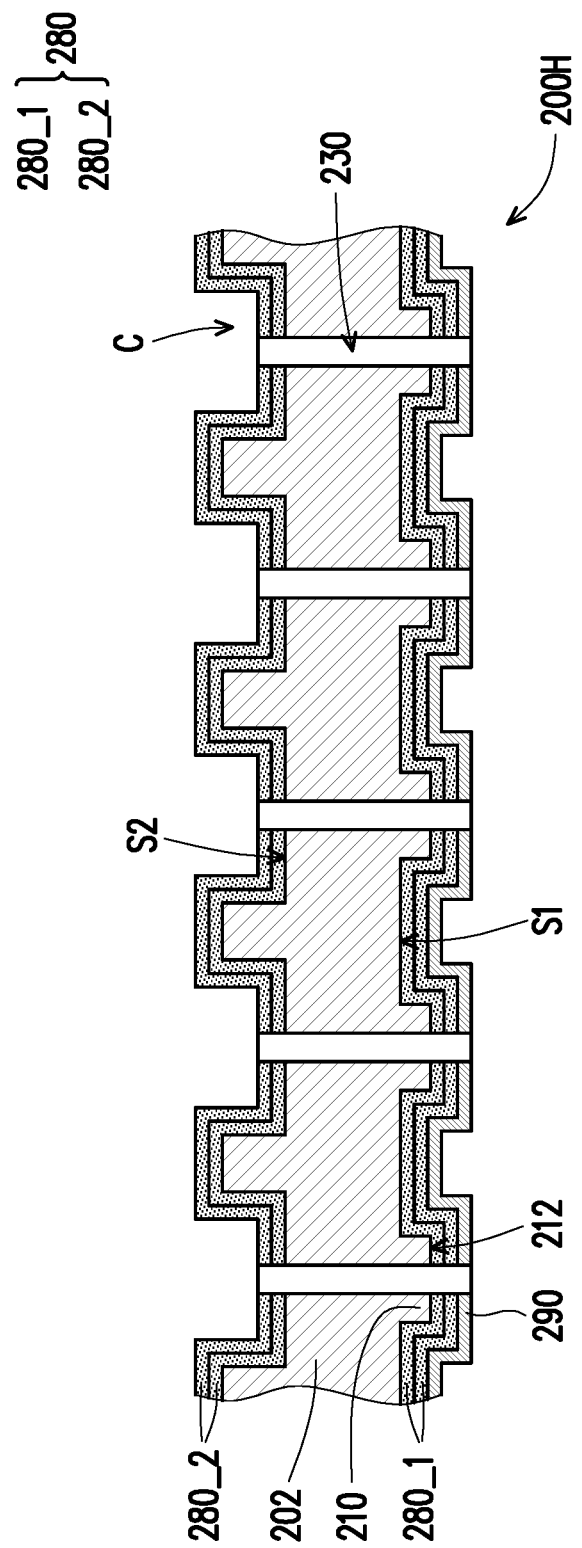
FIG. 20 is a cross-sectional view illustrating a transfer support according to yet another embodiment of the disclosure.

FIG. 20 is a cross-sectional view illustrating a transfer support according to yet another embodiment of the disclosure. Referring to FIG. 20, a transfer support 200H in the embodiment is similar to the transfer support 200G in the FIG. 18 except that the transfer support 200H in the embodiment includes at least one first anti-bending layer 280_1, at least one second anti-bending layer 280_2 and at least one protective layer 290. The first anti-bending layer 280_1 is disposed on the first surface S1, the second anti-bending layer 280_2 is disposed on the second surface S2, the protective layer 290 is disposed on the first anti-bending layer 280_1, and the first anti-bending layer 280_1 is disposed between the second anti-bending layer 280_2 and the protective layer 290, wherein the hardness of the protective layer 290 is greater than the hardness of the element to be attracted. With such configuration, in the embodiment, by choosing the materials of the first anti-bending layer 280_1, the second anti-bending layer 280_2 and the protective layer 290 disposed in the transfer support 200 are matched, the stress of the overall transfer support 200G can be compensated, thereby further preventing warpage generated on the transfer support 200G. In the embodiment, details of the material used for fabricating the protective layer 290 is similar to the protective patterns 270 in FIG. 15, and thus no repetition is incorporated herein.

In the embodiment, the number of the first anti-bending layer 280_1 and the second anti-bending layer 280_2 is two layers, which should not be construed as a limitation to the disclosure. In other words, in some embodiments, the number of the first anti-bending layer 280_1 and the second anti-bending layer 280_2 may be adjusted as single-paired, multiple-paired or unpaired depending on the circumstances such that the stress of the overall transport support 200G can be balanced, which should not be construed as a limitation to the disclosure.

It should be noted that the embodiments of FIG. 15-FIG. 20 regarding realization of the protective patterns 270, the anti-bending layer 280 or protective layer 290 may be further applied to the transfer support in FIG. 1 to FIG. 13, thereby preventing the platform 210 from being damaged due to contact and pressure in the process that the transfer support attracts element. Additionally, since the stress between the anti-bending layer 280 and the protective layer 290 is balanced, it can be avoided that warpage is generated on the transfer support, which should not be construed as a limitation to the disclosure.

In summary, in the transfer module of the disclosure, the transfer support is disposed on the vacuum apparatus so that the exhausting vent communicates with the plurality of through holes, such that the plurality of elements are attracted to the platform via the through holes, thereby transferring the elements to the target substrate rapidly and efficiently.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A transfer support, adapted to contact a plurality of elements, the transfer support comprises a first surface, a second surface opposite to the first surface, a recess located on the second surface, a plurality of platforms protruded from the first surface, a plurality of supporting pillars distributed in the recess and a plurality of through holes, wherein the platforms comprise carry surfaces adapted to contact the elements, the through holes extend from the carry surfaces of the platforms to the recess,
wherein the transfer support further comprises a plurality of protective patterns, respectively disposed on the carry surfaces, wherein the protective patterns are not connected with each other, and a hardness of the protective patterns is greater than a hardness of the elements,
wherein the protective patterns each have at least one protruded limiting portion, and the protective patterns and the protruded limiting portions thereof cover only on the carry surfaces of the platforms.

2. The transfer support according to claim 1, wherein two of the adjacent supporting pillars are spaced from each other to form an airway passage.

3. The transfer support according to claim 1, wherein a hardness of at least one portion of the platforms covered by the protective patterns is greater than a hardness of the elements.

4. The transfer support according to claim 1, wherein the platforms are distributed corresponding to the recess.

5. The transfer support according to claim 1, wherein the through holes are columnar through holes, or the through holes are cone-shaped through holes, an aperture of the through holes increases in a direction from the carry surfaces to the recess.

6. The transfer support according to claim 1, wherein the through holes comprise a plurality of columnar spaces having different apertures and communicating with each other, and the columnar space with a larger aperture is disposed between the columnar space with a smaller aperture and the recess.

7. The transfer support according to claim 1, wherein the greater the distances from the through holes to a center of the recess, the greater is the aperture differences of the columnar spaces of the through holes.

8. The transfer support according to claim 1, wherein the platforms comprise at least a limiting portion protruded from the carry surfaces, the at least one limiting portion is located on an outer edge of the carry surfaces.

9. The transfer support according to claim 8, wherein the protective patterns cover the at least one limiting portion.

10. The transfer support according to claim 8, wherein the at least one limiting portion comprises a tapered surface, when the transfer support contacts the elements, the elements moves along a corresponding tapered surface and contacts the carry surfaces.

11. The transfer support according to claim 1, further comprising:
a plurality of rigid supports, disposed in the through holes.

12. The transfer support according to claim 1, further comprising:
a plurality of marking structures, protruded from the first surface, wherein a height of the marking structures is lower than a height of the platforms.

13. The transfer support according to claim 1, further comprising:
at least one anti-bending layer, disposed on at least one of the first surface or the second surface.

14. A transfer module, adapted to attract a plurality of elements, the transfer module comprises:
a vacuum apparatus, comprising at least an exhausting vent; and
a transfer support according to claim 1, disposed on the vacuuming pumping apparatus so as to cover the at least one exhausting vent.

15. The transfer module according to claim 14, further comprising:
an attraction adjusting member, disposed between the transfer support and the vacuum apparatus, the attraction adjusting member comprises an outer frame and a cavity disposed in the outer frame, the outer frame comprises a plurality of first openings disposed on two opposite sides of the cavity and at least a second opening, wherein the first openings communicate with the through holes, the at least one second opening communicates with the at least one exhausting vent, and the greater the distances from the first openings to a center of the recess, the greater is the aperture sizes of the first openings.

16. The transfer module according to claim 14, wherein the at least one exhausting vent comprises a plurality of first exhausting vents and a plurality of second exhausting vents, the first exhausting vents communicate with the through holes, and the second exhausting vents abut against the supporting pillars so as to attract the transfer support.

17. A transfer support, adapted to contact a plurality of elements, the transfer support comprises a first surface, a second surface opposite to the first surface, a recess located on the second surface, a plurality of platforms protruded from the first surface, a plurality of supporting pillars distributed in the recess and a plurality of through holes, wherein the platforms comprise carry surfaces adapted to contact the elements, the through holes extend from the carry surfaces of the platforms to the recess,
wherein the transfer support further comprises:
a plurality of protective patterns, respectively disposed on the carry surfaces;
a first anti-bending layer, disposed on the first surface; and
a second anti-bending layer, disposed on the second surface, wherein the protective patterns are respectively disposed on the anti-bending layer, the first anti-bending layer is disposed between the second anti-bending layer and the protective patterns, wherein the protective patterns are not connected with each other, and a hardness of the protective patterns is greater than a hardness of the elements.

* * * * *